(12) United States Patent
Banks

(10) Patent No.: US 7,075,825 B2
(45) Date of Patent: *Jul. 11, 2006

(54) ELECTRICALLY ALTERABLE NON-VOLATILE MEMORY WITH N-BITS PER CELL

(75) Inventor: Gerald J. Banks, Fremont, CA (US)

(73) Assignee: BTG International Inc., West Conshohocken, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/808,286

(22) Filed: Mar. 25, 2004

(65) Prior Publication Data

US 2004/0179397 A1 Sep. 16, 2004

Related U.S. Application Data

(60) Division of application No. 10/428,732, filed on May 5, 2003, now Pat. No. 6,724,656, which is a division of application No. 10/160,402, filed on Jun. 4, 2002, now Pat. No. 6,584,012, which is a division of application No. 09/794,041, filed on Feb. 28, 2001, now Pat. No. 6,404,675, which is a division of application No. 09/493,138, filed on Jan. 28, 2000, now Pat. No. 6,243,321, which is a division of application No. 09/195,201, filed on Nov. 18, 1998, now Pat. No. 6,104,640, which is a division of application No. 08/911,731, filed on Aug. 15, 1997, now Pat. No. 5,872,735, which is a division of application No. 08/410,200, filed on Feb. 27, 1995, now Pat. No. 5,764,571, which is a division of application No. 08/071,816, filed on Jun. 4, 1993, now Pat. No. 5,394,362, which is a continuation of application No. 07/652,878, filed on Feb. 8, 1991, now Pat. No. 5,218,569.

(51) Int. Cl.
*G11C 7/00* (2006.01)

(52) U.S. Cl. ............................. 365/185.19; 365/185.03
(58) Field of Classification Search ........... 365/185.03, 365/185.19, 185.2, 185.22, 185.29, 185.33
See application file for complete search history.

(56) References Cited

U.S. PATENT DOCUMENTS 3,660,819 A  5/1972  Frohman-Bentchkowsky ......... 317/235 R (Continued)

FOREIGN PATENT DOCUMENTS

EP  0 390 404  10/1990

(Continued)

OTHER PUBLICATIONS

M. Bauer et al., *A Multilevel-Cell 32Mb Flash Memory*, 1995 IEEE International Solid-State Circuits Conference, Session 7, Paper TA7.7.

(Continued)

*Primary Examiner*—Vu A. Le
(74) *Attorney, Agent, or Firm*—Miles & Stockbridge P.C.

(57) ABSTRACT

An electrically alterable, non-volatile memory cell has more than two memory states that can be programmed selectively. Programming of the cell can be performed without actually reading the memory state of the cell during the programming operation. A plurality of the memory cells are preferably arranged in a matrix of rows and columns disposed substantially in a rectangle, with a plurality of word lines coupled with memory gate electrodes intersecting a first side of the rectangle substantially perpendicularly, a plurality of bit lines coupled with memory drain-source current paths intersecting a second side of the rectangle substantially perpendicularly (the second side also substantially perpendicularly intersecting the first side), a row select circuit being disposed at the first side for coupling with the word lines, and peripheral circuitry including a column select circuit and a sense circuit being disposed at the second side.

65 Claims, 14 Drawing Sheets

U.S. PATENT DOCUMENTS

| | | |
|---|---|---|
| 3,755,721 A | 8/1973 | Frohman-Bentchkowksky ....... 317/235 R |
| 3,801,965 A | 4/1974 | Keller et al. ............. 340/173 R |
| 4,004,159 A | 1/1977 | Rai et al. ...................... 307/238 |
| 4,054,864 A | 10/1977 | Audaire et al. ......... 340/173 R |
| 4,090,258 A | 5/1978 | Cricchi ......................... 365/184 |
| 4,122,541 A | 10/1978 | Uchida ......................... 365/154 |
| 4,139,910 A | 2/1979 | Anantha et al. ............. 365/183 |
| 4,149,270 A | 4/1979 | Cricchi et al. .............. 365/222 |
| 4,181,980 A | 1/1980 | McCoy ......................... 365/45 |
| 4,192,014 A | 3/1980 | Craycraft .................... 365/104 |
| 4,272,830 A | 6/1981 | Moench ........................ 365/45 |
| 4,287,570 A | 9/1981 | Stark ........................... 365/104 |
| 4,300,210 A | 11/1981 | Chakravarti et al. .......... 365/45 |
| 4,306,300 A | 12/1981 | Terman et al. ................. 365/45 |
| 4,327,424 A | 4/1982 | Wu ............................... 365/104 |
| 4,357,685 A | 11/1982 | Daniele et al. .............. 365/189 |
| 4,388,702 A | 6/1983 | Sheppard ..................... 365/104 |
| 4,415,992 A | 11/1983 | Adlhoch ........................ 365/94 |
| 4,417,325 A | 11/1983 | Harari ......................... 365/185 |
| 4,448,400 A | 5/1984 | Harari ......................... 365/185 |
| 4,449,203 A | 5/1984 | Adlhoch ....................... 365/104 |
| 4,462,088 A | 7/1984 | Giuliani et al. .............. 365/105 |
| 4,495,602 A | 1/1985 | Sheppard ..................... 365/104 |
| 4,503,518 A | 3/1985 | Iwahashi ...................... 365/104 |
| 4,558,241 A | 12/1985 | Suzuki et al. ................. 307/530 |
| 4,578,777 A | 3/1986 | Fang et al. .................. 365/184 |
| 4,586,163 A | 4/1986 | Koike .......................... 365/104 |
| 4,612,629 A | 9/1986 | Harari ......................... 365/185 |
| 4,627,027 A | 12/1986 | Rai et al. ....................... 365/45 |
| 4,653,023 A | 3/1987 | Suzuki et al. ................ 365/104 |
| RE32,401 E | 4/1987 | Belistein, Jr. et al. ...... 365/182 |
| 4,661,929 A | 4/1987 | Aoki et al. ................... 365/189 |
| 4,701,884 A | 10/1987 | Aoki et al. ................... 365/189 |
| 4,709,350 A | 11/1987 | Nakagome et al. ........... 365/45 |
| 4,733,394 A | 3/1988 | Giebel ........................... 371/21 |
| 4,771,404 A | 9/1988 | Mano et al. .................. 365/189 |
| 4,799,195 A | 1/1989 | Iwahashi et al. ............. 365/185 |
| 4,809,224 A | 2/1989 | Suzuki et al. ................ 365/168 |
| 4,847,808 A | 7/1989 | Kobatake ..................... 364/900 |
| 4,853,892 A | 8/1989 | Hori .............................. 365/49 |
| 4,890,259 A | 12/1989 | Simko .......................... 365/45 |
| 4,903,236 A | 2/1990 | Nakayama et al. .......... 365/185 |
| 4,914,631 A | 4/1990 | Johnson et al. ......... 365/189.11 |
| 4,964,079 A | 10/1990 | Devin ........................... 365/168 |
| 4,989,179 A | 1/1991 | Simko .......................... 365/45 |
| 5,014,242 A | 5/1991 | Akimoto et al. .............. 365/63 |
| 5,021,999 A | 6/1991 | Kohda et al. ................. 365/168 |
| 5,043,940 A | 8/1991 | Harari ......................... 365/168 |
| 5,095,344 A | 3/1992 | Harari ........................ 357/23.5 |
| 5,163,021 A | 11/1992 | Mehrotra et al. ........... 365/185 |
| 5,168,465 A | 12/1992 | Harari ......................... 257/320 |
| 5,172,338 A | 12/1992 | Mehrotra et al. ........... 365/185 |
| 5,198,380 A | 3/1993 | Harari ........................... 437/43 |
| 5,200,920 A | 4/1993 | Norman et al. ............. 365/185 |
| 5,200,959 A | 4/1993 | Gross et al. ................. 371/21.6 |
| 5,258,958 A | 11/1993 | Iwahashi et al. ............. 365/210 |
| 5,262,984 A | 11/1993 | Noguchi et al. ............. 365/185 |
| 5,268,318 A | 12/1993 | Harari ........................... 437/43 |
| 5,268,319 A | 12/1993 | Harari ........................... 437/43 |
| 5,268,870 A | 12/1993 | Harari ......................... 365/218 |
| 5,272,669 A | 12/1993 | Samachisa et al. .......... 365/185 |
| 5,293,560 A | 3/1994 | Harari ......................... 365/185 |
| 5,295,255 A | 3/1994 | Malecek et al. ............. 395/425 |
| 5,321,655 A | 6/1994 | Iwahashi et al. ............. 365/200 |
| 5,351,210 A | 9/1994 | Saito ....................... 365/189.01 |
| 5,394,362 A | 2/1995 | Banks .................... 365/189.01 |
| 5,422,845 A | 6/1995 | Ong .............................. 365/185 |
| 5,432,735 A | 7/1995 | Parks et al. .................. 365/168 |
| 5,434,825 A | 7/1995 | Harari ......................... 365/185 |
| 5,440,505 A | 8/1995 | Fazio et al. .................... 365/45 |
| 5,444,656 A | 8/1995 | Bauer et al. ............ 365/189.01 |
| 5,450,363 A | 9/1995 | Christopherson et al. ... 365/205 |
| 5,457,650 A | 10/1995 | Sugiura et al. .............. 365/184 |
| 5,469,384 A | 11/1995 | Lacey ..................... 365/185.13 |
| 5,475,693 A | 12/1995 | Christopherson et al. .. 371/10.2 |
| 5,485,422 A | 1/1996 | Bauer et al. ................. 365/168 |
| 5,497,119 A | 3/1996 | Tedrow et al. ............... 327/540 |
| 5,506,813 A | 4/1996 | Mochizuki et al. ..... 365/230.03 |
| 5,508,958 A | 4/1996 | Fazio et al. ............. 365/185.19 |
| 5,515,317 A | 5/1996 | Wells et al. .................. 395/427 |
| 5,523,972 A | 6/1996 | Rashid et al. ........... 365/185.22 |
| 5,539,690 A | 7/1996 | Talreja et al. ........... 365/185.22 |
| 5,541,886 A | 7/1996 | Hasbun .................. 365/230.01 |
| 5,544,118 A | 8/1996 | Harari ......................... 365/218 |
| 5,550,772 A | 8/1996 | Gill ......................... 365/185.03 |
| 5,554,553 A | 9/1996 | Harari ............................ 437/43 |
| 5,568,439 A | 10/1996 | Harari ......................... 365/218 |
| 5,583,812 A | 12/1996 | Harari ..................... 365/185.33 |
| 5,594,691 A | 1/1997 | Bashir .................... 365/189.09 |
| 5,596,527 A | 1/1997 | Tomioka et al. ......... 365/185.2 |
| 5,642,312 A | 6/1997 | Harari .................... 365/185.33 |
| 5,712,819 A | 1/1998 | Harari .................... 365/185.29 |
| 5,764,571 A | 6/1998 | Banks .................... 365/189.01 |
| 5,768,184 A | 6/1998 | Hayashi et al. ......... 365/185.03 |
| 5,872,735 A | 2/1999 | Banks .................... 365/189.01 |
| 6,002,614 A | 12/1999 | Banks .................... 365/189.01 |
| 6,011,716 A | 1/2000 | Banks .................... 365/185.03 |
| 6,014,327 A | 1/2000 | Banks .................... 365/185.03 |
| 6,104,640 A | 8/2000 | Banks .................... 365/189.01 |
| 6,118,692 A | 9/2000 | Banks .................... 365/185.03 |
| 6,243,321 B1 | 6/2001 | Banks ........................... 365/233 |
| 6,246,613 B1 | 6/2001 | Banks .................... 365/189.01 |
| 6,324,121 B1 | 11/2001 | Banks .................... 365/185.03 |
| 6,327,189 B1 | 12/2001 | Banks .................... 365/189.01 |
| 6,339,545 B1 | 1/2002 | Banks .................... 365/185.03 |
| 6,343,034 B1 | 1/2002 | Banks ........................... 365/189 |
| 6,344,998 B1 | 2/2002 | Banks .................... 365/185.22 |
| 6,353,554 B1 | 3/2002 | Banks .................... 365/185.03 |
| 6,356,486 B1 | 3/2002 | Banks .................... 365/189.01 |
| 6,381,172 B1 | 4/2002 | Banks .................... 365/185.03 |
| 6,404,675 B1 | 6/2002 | Banks .................... 365/185.03 |
| 6,434,050 B1 | 8/2002 | Banks ....................... 365/185.2 |
| 2003/0202378 A1 | 10/2003 | Banks .................... 365/185.03 |

FOREIGN PATENT DOCUMENTS

| | | |
|---|---|---|
| FR | 2 630 574 | 10/1989 |
| JP | 56-114199 | 9/1981 |
| JP | 59-63095 | 4/1984 |
| JP | 61-239497 | 10/1986 |
| JP | 61-239498 | 10/1986 |
| JP | 62-6493 | 1/1987 |
| JP | 62-24499 | 2/1987 |
| JP | 1-159895 | 6/1989 |
| JP | 2-227900 | 9/1990 |
| JP | 3-242898 | 10/1991 |
| JP | 4-507320 | 12/1992 |
| JP | 5-217385 | 8/1993 |
| JP | 5-282881 | 10/1993 |
| JP | 6-68682 | 3/1994 |
| JP | 7-029383 | 1/1995 |
| JP | 7-161852 | 6/1995 |
| JP | 8-195092 | 7/1996 |
| JP | 8-274282 | 10/1996 |
| JP | 9-181279 | 7/1997 |
| WO | WO82/02276 | 7/1982 |
| WO | WO82/02976 | 9/1982 |
| WO | WO90/01984 | 3/1990 |

OTHER PUBLICATIONS

John A. Bayliss et al., *The Interface Processor for the 32b Computer*, 1981 IEEE International Solid-State Circuits Conference, Feb. 1981, at 116-117.

Christoph Bleiker & Hans Melchior, *A Four-State EEPROM Using Floating-Gate Memory Cells*, IEEE Journal of Solid-State Circuits, vol. SC-22, No. 3, Jun. 1987, at 260-263.

Raymond A. Heald & David A. Hodges, *Multilevel Random-Access Memory Using One Transistor Per Cell*, IEEE Journal of Solid-State Circuits, vol. SC-11, No. 4, Aug. 1976, at 519-528.

David A. Rich, *A Survey of Multivalued Memories*, IEEE Transactions on Computers, vol. C-35, No. 2, Feb. 1986, at 99-106.

R.S. Withers et al., *Nonvolatile Analog Memory in MNOS Capacitors*, IEEE Electron Device Letters, vol. EDL-1, No. 3, Mar. 1980, at 42-45.

Intel Corporation. "2764A Advanced 64K (8K×8) Production and UV Erasable PROMs." Memory Components Handbook. (Oct. 1985): 4.10-4.20.

Alberts, G.S., and Kotecha, H.N. "Multi-Bit Storage FET EAROM Cell." IBM Technical Disclosure Bulletin, vol. 24, No. 7A. (Dec. 1981): 3311-3314.

Blyth, Trevor, et al. "TPM 11.7: A Non-Volatile Analog Storage Device Using EEPROM Technology." 1991 IEEE International Solid-State Circuits Conference, Digest of Technical Papers. (Feb. 1991): 192-193 and 315.

Donoghue, Bill, et al. "A 256K HCMOS ROM Using a Four-State Cell Approach." IEEE Journal of Solid-State Circuits, vol. SC-20, No. 2. (Apr. 1985): 598-602.

"Mid-Level Current Generator Circuit", IBM Technical Disclosure Bulletin, vol. 33, No. 1B, Jun. 1, 1990, pp. 386-388.

Torelli, Guido et al., "An Improved Method for Programming a Word-Erasable EEPROM", *Alta Frequenza—Scientific Review in Electronics*, vol. LII, No. 6, pp. 487-494 (1983).

Yoshikawa, Kuniyoshi et al., "An Asymmetrical Lightly-Doped Source (ALDS) Cell for Virtual Ground High Density EPROMs", *IEEE International Electron Devices Meeting*, 1988, pp. 432-435.

*PRIOR ART READ*

ELECTRICALLY ALTERABLE NON-VOLATILE MEMORY WITH N-BITS PER CELL

CROSS-REFERENCE TO RELATED APPLICATIONS

This application is a division of application Ser. No. 10/428,732 filed May 5, 2003 now U.S. Pat. No. 6,724,656, which is a division of application Ser. No. 10/160,402 filed Jun. 4, 2002 now U.S. Pat. No. 6,584,012, which is a division of application Ser. No. 09/794,041 filed Feb. 28, 2001 now U.S. Pat. No. 6,404,675, which is a division of application Ser. No. 09/493,138 filed Jan. 28, 2000 now U.S. Pat. No. 6,243,321, which is a division of application Ser. No. 09/195,201 filed Nov. 18, 1998 now U.S. Pat. No. 6,104,640, which is a division of application Ser. No. 08/911,731 filed Aug. 15, 1997 now U.S. Pat. No. 5,872,735, which is a division of application Ser. No. 08/410,200 filed Feb. 27, 1995 now U.S. Pat. No. 5,764,571, which is a division of application Ser. No. 08/071,816, filed Jun. 4, 1993 now U.S, Pat. No. 5,394,362, which is a continuation of application Ser. No. 07/652,878 filed Feb. 8, 1991 now U.S. Pat. No. 5,218,569.

BACKGROUND OF THE INVENTION

1. Field of the Invention

This invention relates to non-volatile memory (NVM) devices and, more particularly, is concerned with an apparatus and method for programming and/or verifying programming of a multi-level NVM device.

2. Description of the Background Art

In conventional single-bit per cell memory devices, the memory cell assumes one of two information storage states, either an "on" state or an "off" state. This combination of either "on" or "off" defines one bit of information. As a result, a memory device which can store n-bits of data requires n separate memory cells.

Increasing the number of bits which can be stored in a single-bit per cell memory device relies upon increasing the number of memory cells on a one-for-one basis with the number of bits of data to be stored. Methods for increasing the number of memory bits in a single memory device have relied upon the following advanced manufacturing techniques: manufacture larger die which contain more memory cells; or use improved lithography techniques to build smaller memory cells and allow more memory cells to be placed in a given area on a single chip.

An alternative approach to the single-bit per cell approach involves storing multiple-bits of data in a single memory cell. Previous approaches to implementing multiple-bit per cell non-volatile memory devices have only involved mask programmable read only memories (ROMs). In one of these approaches, the channel width and/or length of the memory cell is varied such that $2^n$ different conductivity values are obtained which correspond to $2^n$ different states corresponding to n-bits of data which can be stored on a single memory cell. In another approach, the ion implant for the threshold voltage is varied such that the memory cell will have $2^n$ different voltage thresholds (Vt) corresponding to $2^n$ different conductance levels corresponding to $2^n$ different states corresponding to n-bits of data which can be stored on a single memory cell. Examples of memory devices of these types are described in U.S. Pat. No. 4,192,014 by Craycraft, U.S. Pat. No. 4,586,163 by Koike, U.S. Pat. No. 4,287,570 by Stark, U.S. Pat. No. 4,327,424 by Wu, and U.S. Pat. No. 4,847,808 by Kobatake.

Single-bit per cell read-only-memory devices are only required to sense, or read, two different levels or states per cell, consequently they have need for only one voltage reference. Sensing schemes for multi-level memory devices are more complex and require $2^n-1$ voltage references. Examples of such multiple state sensing schemes for ROMs are described in U.S. Pat. No. 4,449,203 by Adlhoch, U.S. Pat. No. 4,495,602 by Shepard, U.S. Pat. No. 4,503,578 by Iwahashi, and U.S. Pat. No. 4,653,023 by Suzuki.

These approaches to a multi-bit ROM commonly have one of $2^n$ different conductivity levels of each memory cell being determined during the manufacturing process by means of a customized mask that is valid for only one data pattern. Thus, for storing n different data information patterns, a minimum of n different masks need to be produced and incorporated into a manufacturing process. Each time a data information pattern needs to be changed a new mask must be created and a new batch of semiconductor wafers processed. This dramatically increases the time between a data pattern change and the availability of a memory product programmed with that new data pattern.

Prior art electrically alterable multiple-bit per cell memory approaches store multiple levels of charge on a capacitive storage element, such as is found in a conventional dynamic random access memory (DRAM) or a charge coupled device (CCD). Such approaches are described in U.S. Pat. No. 4,139,910 by Anantha, U.S. Pat. No. 4,306,300 by Terman, U.S. Pat. No. 4,661,929 by Aoki, U.S. Pat. No. 4,709,350 by Nakagome, and U.S. Pat. No. 4,771,404 by Mano. All of these approaches use volatile storage, that is, the charge levels are not permanently stored. They provide $2^n$ different volatile charge levels on a capacitor to define $2^n$ different states corresponding to n-bits of data per memory cell. All of these approaches have the common characteristic that whatever information is stored on such a memory cell is volatile because such a cell loses its data whenever power is removed. Furthermore, these types of memory cells must be periodically refreshed as they have a tendency to lose charge over time even when power is maintained.

It would be advantageous to develop a multi-bit semiconductor memory cell that has the non-volatile characteristic of a mask programmable read-only-memory (ROM) and the electrically alterable characteristic of a multi-bit per cell DRAM. These characteristics combined in a single cell would provide a multi-bit per cell electrically alterable non-volatile memory (EANVM) capable of storing $K^n$ bits of data, where "K" is the base of the numbering system being used and "n" is the number of bits to be stored in each memory cell. Additionally, it would be advantageous if the EANVM described above was fully compatible with conventional industry standard device programmers/erasers and programming/erasing algorithms such that a user can program/erase the multi-bit per cell memory in a manner identical to that used for current single-bit per cell memory devices.

SUMMARY OF THE INVENTION

The present invention provides a multi-level electrically alterable non-volatile-memory (EANVM) device, wherein some or all of the storage locations have more than two distinct states.

In a specific embodiment, the present invention provides a multi-level memory device. The present multi-level memory device includes a multi-level cell means for storing input information for an indefinite period of time as a discrete state of the multi-level cell means. The multi-level cell means stores information in $K^n$ memory states, where K is a base of a predetermined number system, n is a number of bits stored per cell, and $K^n>2$. The present multi-level memory device also includes a memory cell programming means for programming the multi-level cell means to a state corresponding to the input information. A comparator means for comparing, the memory state of the multi-level cell means with the input information is also included. The input information corresponds to one of a plurality of reference voltages. The present comparator means further generates a control signal indicative of the memory state as compared to the input information.

An alternative specific embodiment also provides a multi-level memory devices. The present multi-level memory device includes a multi-level cell means for storing input information for an indefinite period of time as a discrete state of the multi-level cell means. The multi-level cell means stores information in $K^n$ memory states, where K is a base of a predetermined number system, n is a number of bits stored per cell, and $K^n>2$. A memory cell programming means for programming the multi-level cell means to a state corresponding to the input information is also included. The present multi-level memory device further includes a comparator means for comparing the memory state of the multi-level cell means with the input information. The input information corresponds to one of a plurality of reference voltages. The present comparator means further generates a control signal indicative of the memory state as compared to the input information. A reference voltage means for defining the plurality of reference voltages is also included. The present reference voltage means is operably coupled to the comparator means.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF THE PREFERRED EMBODIMENT

Reference will now be made in detail to the specific embodiments of the invention, examples of which are illustrated in the accompanying drawings. While the invention will be described in conjunction with the specific embodiments, it will be understood that they are not intended to limit the invention to those embodiments. On the contrary, the invention is intended to cover various alternatives, modifications and equivalents, which may be included within the spirit and scope of the invention as defined by the appended claims.

In general, the invention described here allows n-bits of information to be stored on and read from an Electrically Alterable Non-Volatile Memory (EANVM). This is accomplished by electrically varying the conductivity of the channel of a floating gate FET to be within any one of $K^n$ conductivity ranges where "K" represents the base of the numbering system being employed (in a binary system, "K" equals 2). The conductivity range is then sensed and encoded. This forms the basis of an n-bit EANVM memory cell. The floating gate FET conductivity is electrically modified by using external programming hardware and algorithms which supply signals and voltages to the EANVM memory device.

These external signals and voltages are then modified internal to the device to provide an internally controlled program/verify cycle which incrementally stores electrons on the floating gate until the desired conductivity range is achieved. For the purpose of illustration, the n-bit per cell descriptions will assume a binary system which stores 2-bits per memory cell.

I. Prior Art Single-Bit EANVM Devices

Figure 1:
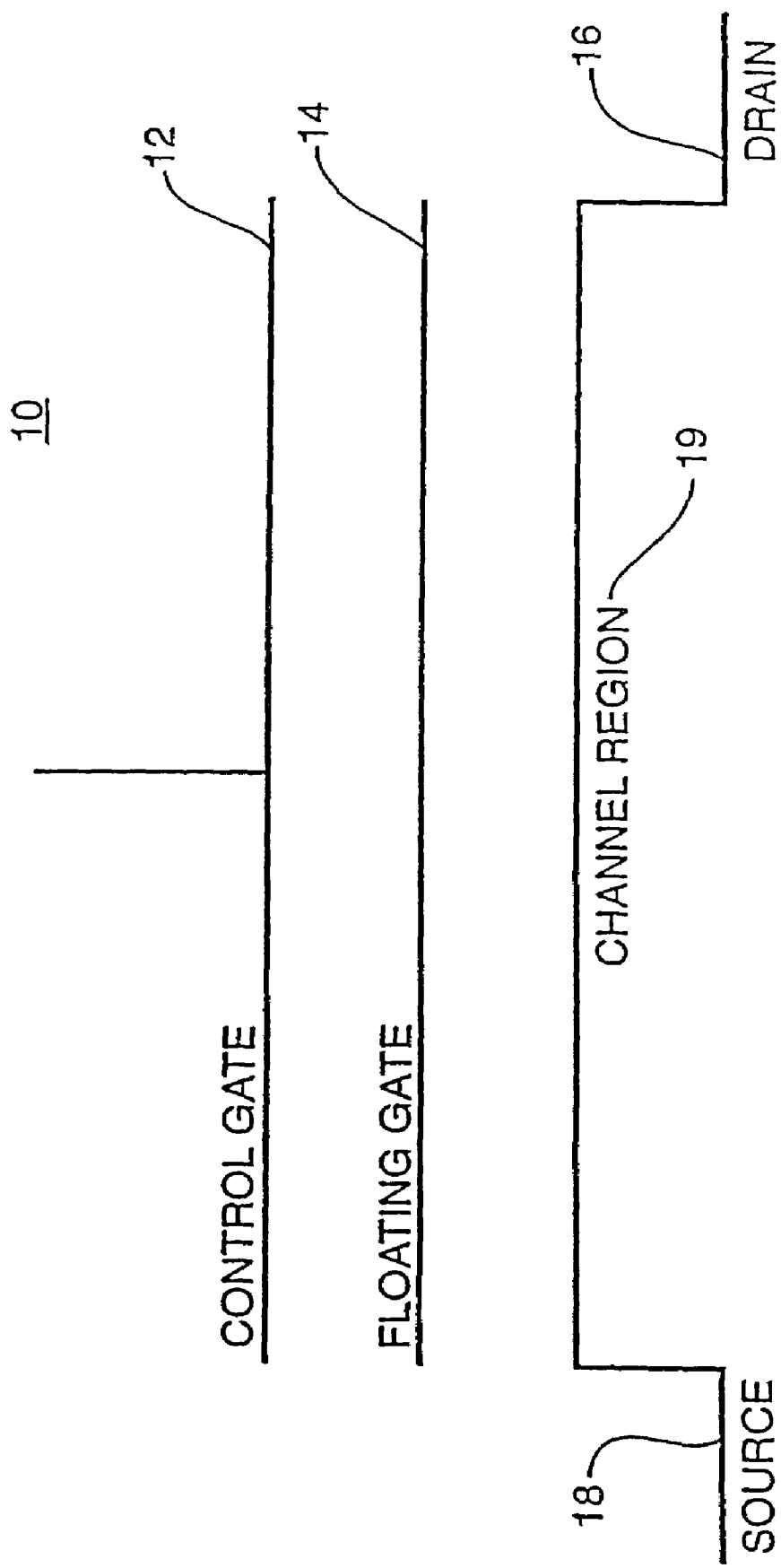
FIG. 1 is a generic schematic representation of a non-volatile floating gate memory cell.

FIG. 1 is a generic schematic representation of a non-volatile floating gate memory cell 10. It is not intended that this schematic drawing is in any way indicative of the device structure. It is used to illustrate the fact that this invention refers to an FET memory cell which uses an electrically isolated, or floating, gate 14 to store charged particles for the purpose of altering the voltage threshold and hence channel conductivity of the FET memory cell 10.

The FET memory cell 10 includes a control gate 12 which is used either to select the memory cell for reading or is used to cause electrons to be injected onto the floating gate 14 during the programming process. Floating gate 14 is an electrically isolated structure which can indefinitely store electrons. The presence or absence of electrons on floating gate 14 alters the voltage threshold of the memory cell 10 and as a result alters the conductivity of its channel region. A drain region 16 of the FET is coupled to a source region 18 by a channel region 19. When the floating gate 14 is fully erased and the control gate 12 has been selected, the channel region 19 is in the fully "on", or high conductivity, state. When the floating gate 14 is fully programmed the channel region 19 is in the fully "off", or low conductivity state.

Figure 2:
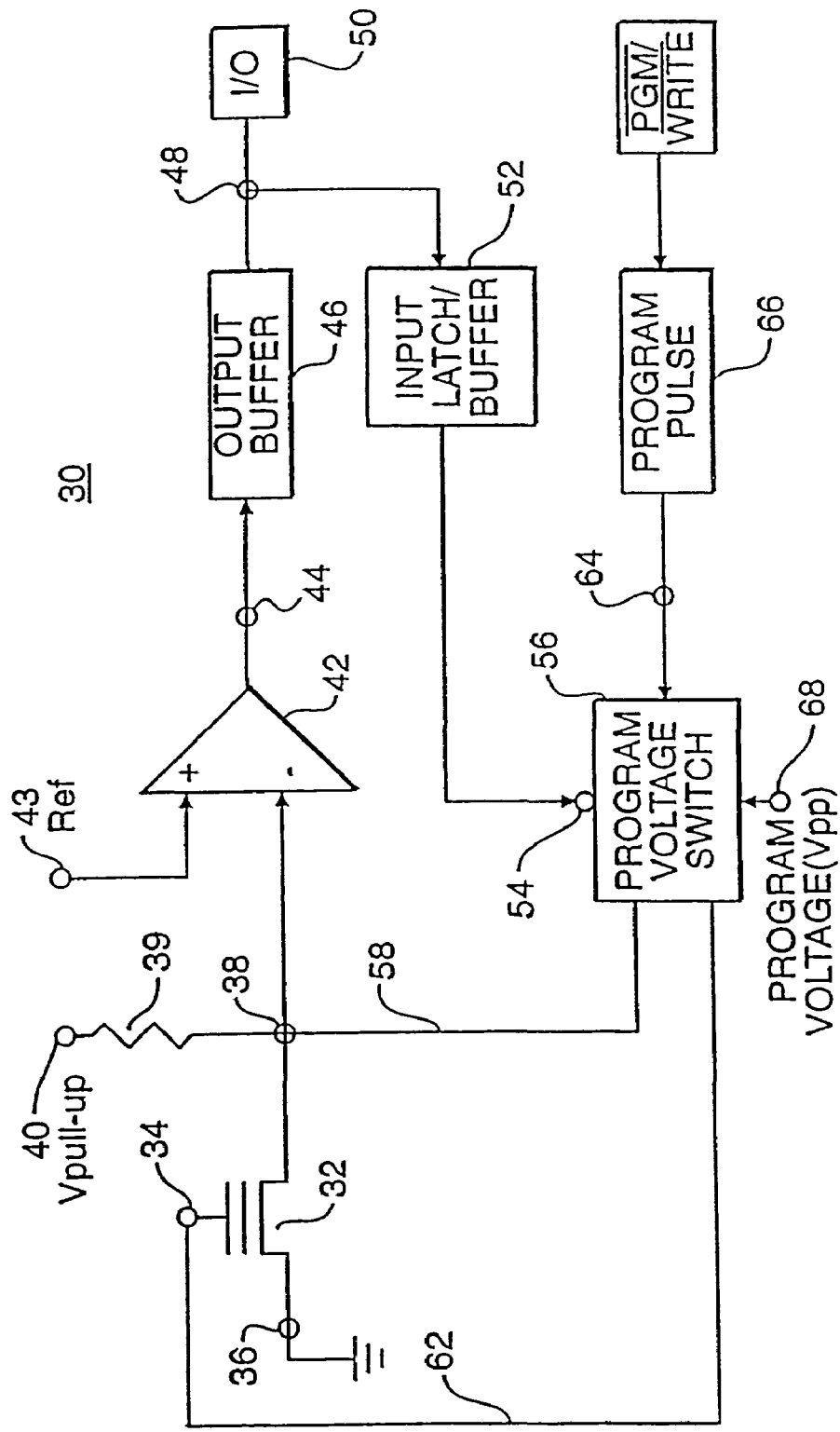
FIG. 2 is a block diagram of a prior art single-bit memory system.

FIG. 2 is a block diagram of a prior art conventional single-bit EANVM memory system 30. The memory system 30 stores a single bit of information in an EANVM cell 32. The cell 32, as described in FIG. 1, is selected for reading or writing when a row, or word, select signal is applied to a control gate terminal 34. A source terminal 36 for the FET of the cell 32 is connected to a reference ground potential. A drain terminal 38 is connected through a pull-up device 39 to a voltage Vpull-up at a terminal 40. Terminal 38 serves as the output terminal of the cell 32. When the cell 32 stores a "0" bit, the channel of the FET is in a low conductivity, or high impedance, state so that the voltage at terminal 38 is pulled-up to the voltage level Vpull-up on terminal 40. When the cell 32 stores a "1" bit, the channel of the FET is in a high conductivity, or low impedance, state so that the voltage at terminal 38 is pulled-down by the ground potential at terminal 36.

For reading the value of the single-bit stored in the cell 32, a sense amplifier 42 compares the voltage at terminal 38 with a reference voltage Vref at terminal 43. If a "0" is stored in the EANVM cell 32, the cell will be in a low conductivity state and as a result the voltage at terminal 38 is above the reference voltage at terminal 43. For a "0" stored in the cell 32, the output terminal 44 of the sense amplifier 42 will be a low voltage which will be transmitted through an output buffer 46 to a terminal 48 and then coupled to the I/O terminal 50 as a logical "0". If a "1" is stored on the EANVM cell 32, the cell is in a high conductivity state and as a result the voltage at terminal 38 is below the reference voltage at terminal 43. The output of the sense amplifier 42 will be a high voltage which will be transmitted to the I/O terminal 50 as a logical "1".

For writing the value of an information bit stored in the cell 32, it is assumed that the cell 32 is in the erased, or fully "on", state which corresponds to a logical "1". The I/O terminal 50 is connected to the input terminal of an input latch/buffer 52. The output of the input latch/buffer 52 is connected to an enable/disable terminal 54 of a program voltage switch 56. The program voltage switch 56 provides a bit-line program voltage on a signal line 58 connected to terminal 38. Another output from the program voltage switch 56 is the word line program voltage on a,signal line 62, which is connected to the control gate 34 of the EANVM cell 32. When a logical "0" is present at terminal 54 of the program voltage switch 56 from the output of Input Latch/Buffer 52 and when the program voltage switch 56 is activated by a program pulse on a signal line 62 from a program pulse 66, activated by a PGM/Write signal, the program voltage switch 56 provides the program voltage Vpp from a terminal 68 to the control gate 34 of the EANVM cell 32. The program voltage switch 56 also biases the drain of the EANVM cell 32 to a voltage, typically between 8 to 9 volts, and the gate of the EANVM cell 32 to the program voltage Vpp, typically 12 volts. Under these conditions, electrons are injected onto the floating gate by a phenomenon known as hot electron injection. This programming procedure raises the voltage threshold of the EANVM cell which increases its source-drain impedance. This continues until the FET memory cell 32 is effectively turned off, which corresponds to a "0" state. When a "1" is present on terminal 54 from the output of the Input Latch/Buffer 52 and when the PGM/Write is enabled, the signal line 58 is driven low and programming is inhibited and the "1", or erased, state is maintained.

Figure 3:
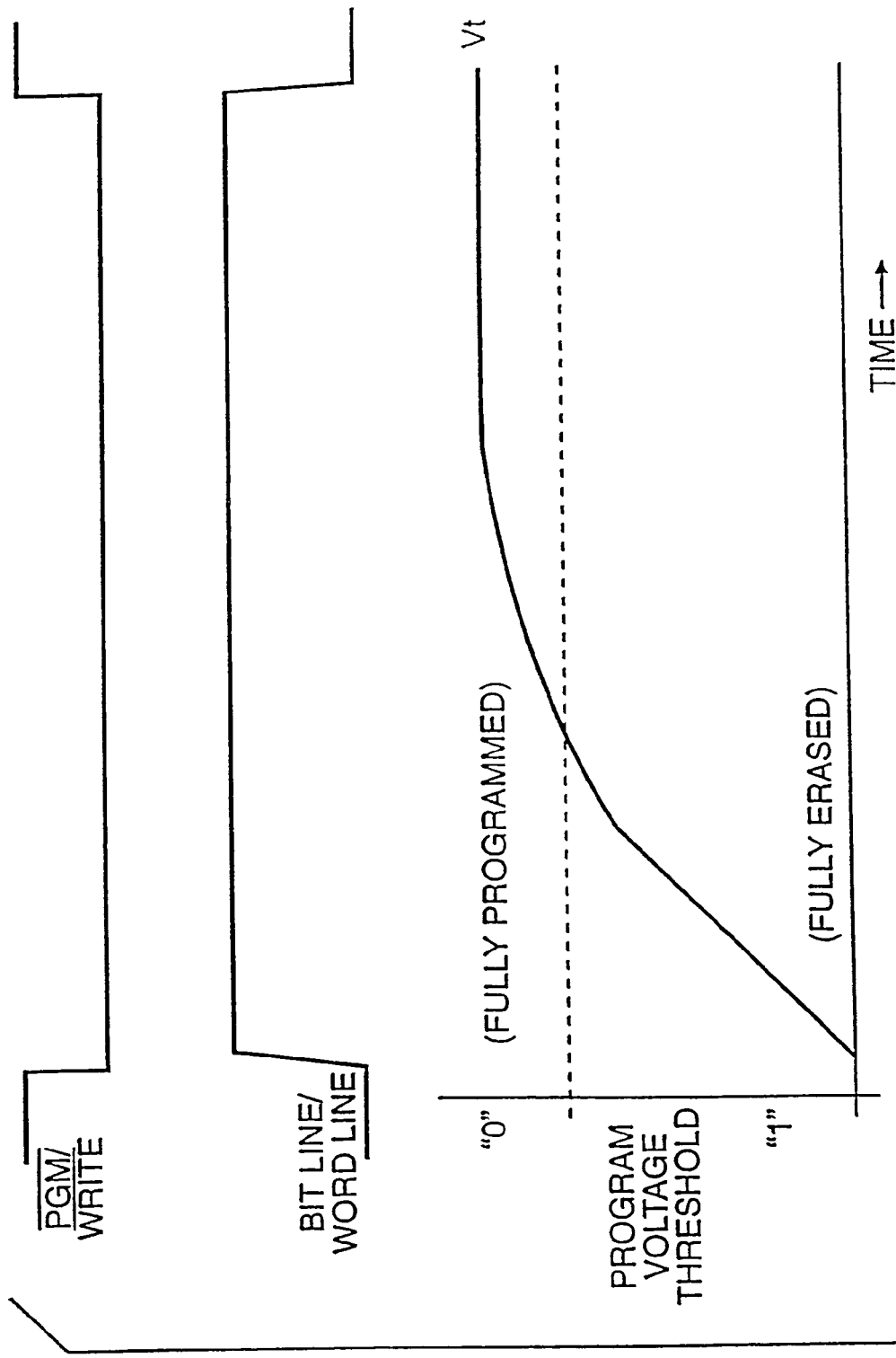
FIG. 3 is a timing diagram of the voltage threshold of a prior art single-bit per cell EANVM system being programmed from an erased "1" state to a programmed "0".

FIG. 3 is a timing diagram of a prior-art single-bit EANVM cell 32, as described in connection with FIG. 2. The timing diagram shows the change in voltage threshold of the EANVM cell 32, as controlled by the word line and bit line programming voltages, which are illustratively shown as a single signal and which are both controlled by the PGM/Write signal. The memory cell is being programmed from the fully erased "1" state to the fully programmed "0" state. For the duration of the PGM/Write pulse, the bit and word line program voltages, which need not be the same, are respectively applied to the drain connected to the bit line terminal 38 and to the control gate 34 of the memory cell 32. As electrons are injected onto the floating gate, the voltage threshold of the memory cell begins to increase. Once the voltage threshold has been increased beyond a specific threshold value as indicated by the dashed horizontal line, the memory cell 32 is programmed to a "0" state.

Note that Fowler-Nordheim tunnelling can also be used instead of hot electron injection to place electrons on the floating gate. The multi-bit EANVM device described here functions with either memory cell programming technique. The prior art programming algorithms and circuits for either type of programming are designed to program a single-bit cell with as much margin as possible in as short a time as possible. For a single-bit memory cell, margin is defined as the additional voltage threshold needed to insure that the programmed cell will retain its stored value over time.

Figure 4:
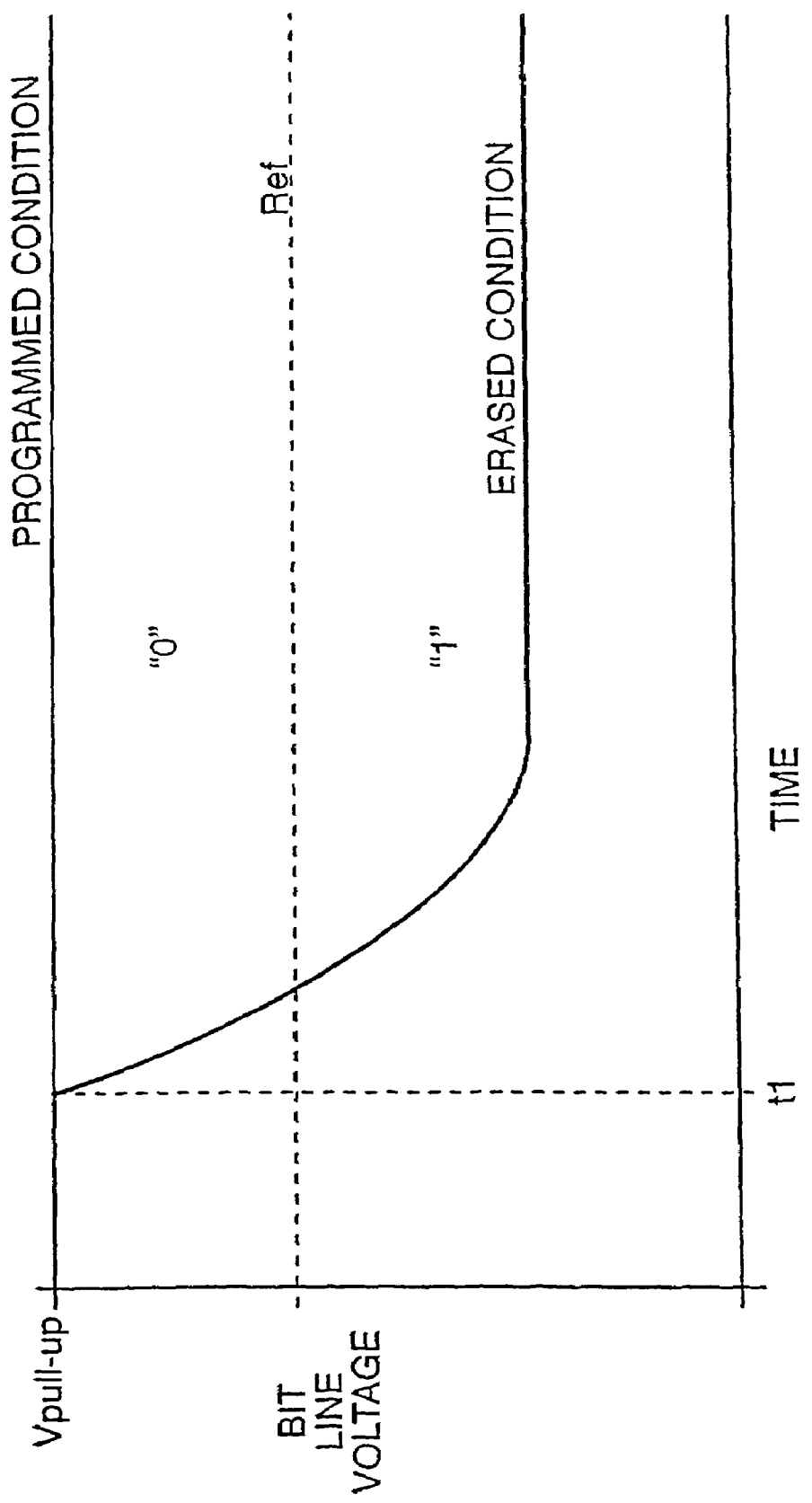
FIG. 4 is a timing diagram of the bit line voltage of a prior single-bit per cell EANVM during a read operation. It illustrates waveform levels for both the programmed and erased conditions.

FIG. 4 is a timing diagram showing the bit line voltage at terminal 38 as a function of time during a memory read operation. In this example, prior to time t1 the bit line is charged to the Vpull-up condition. Note that it is also possible that the bit line may start at any other voltage level prior to time t1. At time t1 the EANVM cell 32 is selected and, if the cell 32 is in the erased or "1" state, the cell 32 provides a low impedance path to ground. As a result, the bit line is pulled down to near the ground potential provided at terminal 36 in FIG. 2. If the EANVM cell 32 were in the "0" or fully programmed state, the bit line voltage would remain at the Vpull-up voltage after time t1. The voltage on the bit-line terminal 38 and the reference voltage Vref at terminal 43 are compared by the comparator 42, whose buffered output drives I/O terminal 50. When Vref is greater than the bit line voltage, the output on I/O terminal 50 is a logical "1". When Vref is lower than the bit line voltage, the output on I/O terminal 50 is a logical "0".

II. Memory Array for a Multi-Bit EANVM System

Figure 5:
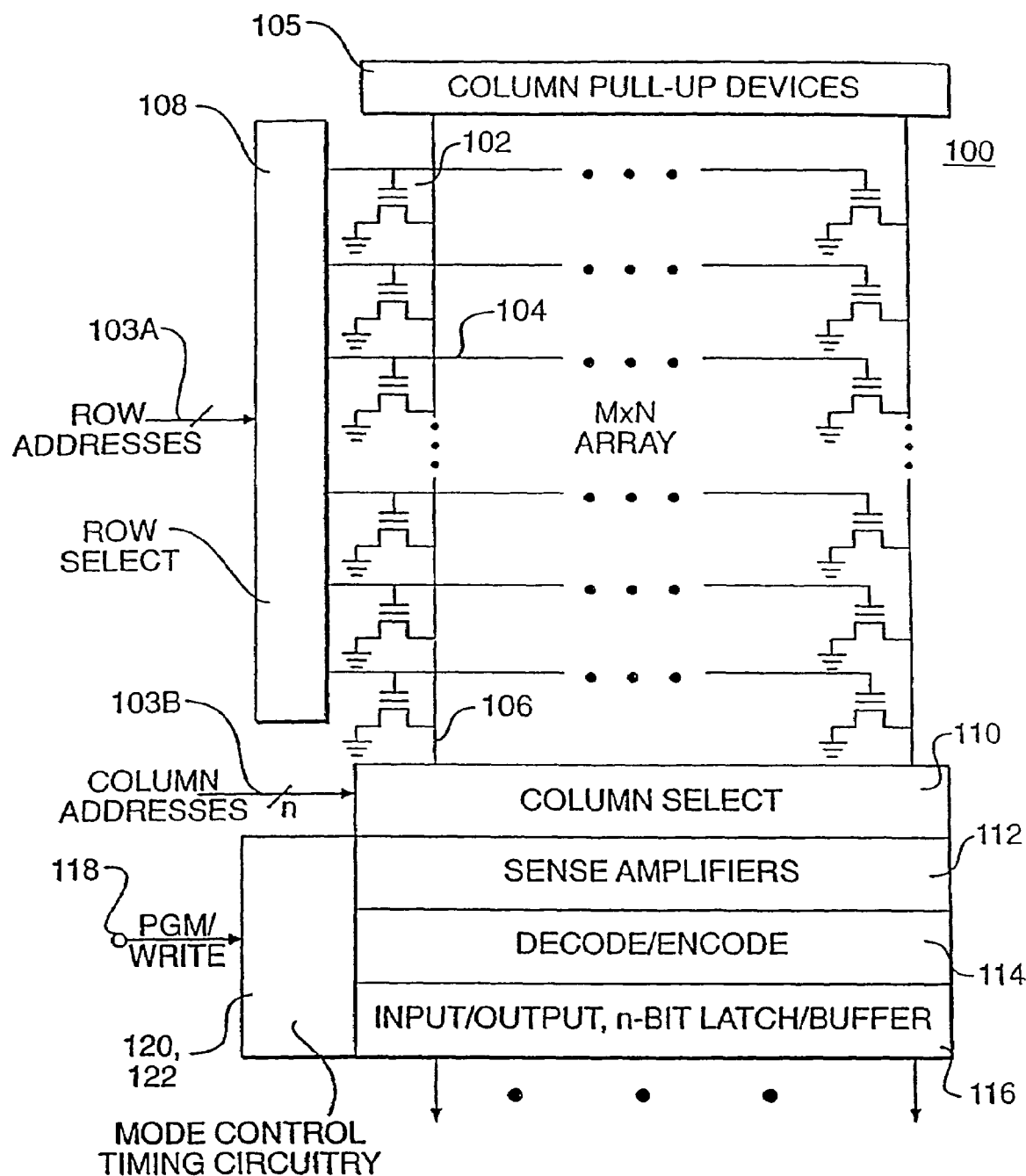
FIG. 5 is a block diagram of an M×N memory array implementing a multi-bit per cell EANVM system.

FIG. 5 is a block diagram of a multi-bit per cell EANVM system 100 which includes an M×N array of memory cells. The cells are typically shown as a floating gate FET, or EANVM, 102, as described in connection with FIG. 1. The array uses similar addressing techniques, external control signals, and I/O circuits as are used with currently available single bit per cell EANVM devices such as EPROM, EEPROM, FLASH, etc. devices. Row Address signals are provided at input terminals 103A and Column Address signals are provided at input terminals 103B.

Each of the EANVM cells in a row of cells has its source connected to a ground reference potential and its drain connected to a column bit line, typically shown as 106. Each of the columns is connected to a pull-up device, as indicated by the block 105. All of the control gates of a row are connected to a row select, or word, line, typically shown as 104. Rows are selected with a row select circuit 108 and columns are selected with a column select circuit 110. Sense amplifiers 112 are provided for each of the selected columns. Decode/encode circuits 114 and n-bit input/output latches/buffers 116 are also provided. A PGM/Write signal is provided at an input terminal 118 for activating a mode control circuit 120 and a timing circuit 122.

A significant feature of this n-bit per cell system 100 as compared to a single-bit per cell implementation is that the memory density is increased by a factor of n, where n is the number of bits which can be stored on an individual multi-bit memory cell.

III. Basic Read Mode of an N-Bit Memory Cell

Figure 6:
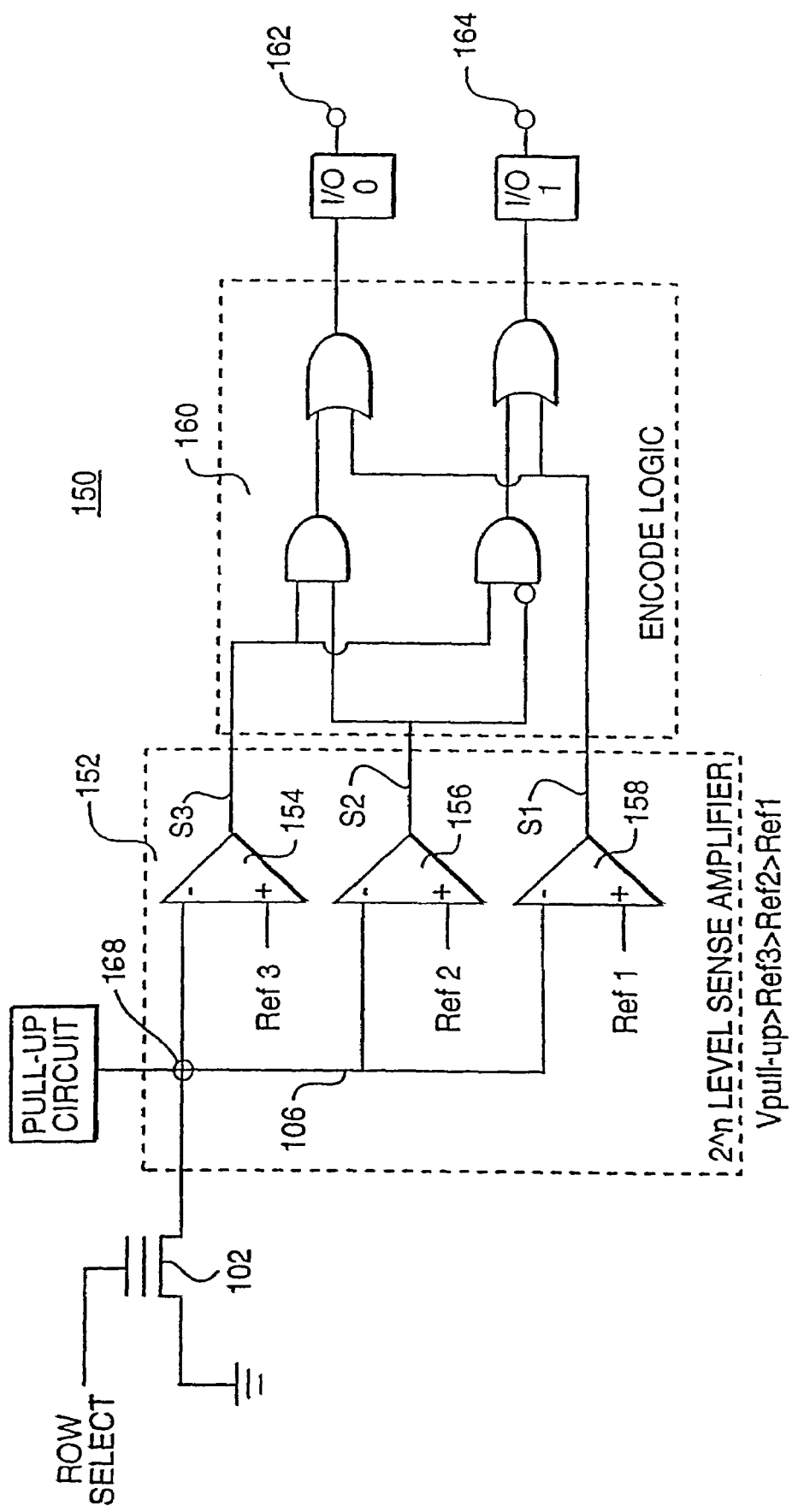
FIG. 6 is a block diagram for reading a multi-bit per cell EANVM system.

FIG. 6 shows a binary system 150 for reading the state of an n-bit floating gate memory cell 102, as described in connection with FIG. 1, according to the invention, where n is the number of bits stored in the memory cell. For this example, n is set to 2 and one of four states of the memory cell must be detected. The four possible states being, (0,0), (0,1), (1,0), or (1,1). Detecting which state is programmed requires a 3-level sense amplifier 152. This amplifier includes three sense amplifiers 154, 156, 158 each of which have their negative input terminals connected to the output terminal 168 of the memory cell 102. Sense amplifier 154 has a reference voltage Ref 3 connected to its positive input terminal. Sense amplifier 156 has a reference voltage Ref 2 connected to its positive input terminal. Sense amplifier 158 has a reference voltage Ref 1 connected to its positive input terminal. The voltage references are set such as follows: Vpull-up>Ref 3>Ref 2>Ref 1. The respective output signals S3, S2, S1 of the three sense amplifiers drive an encode logic circuit 160, which encodes the sensed signals S3, S2, S1 into an appropriate 2-bit data format. Bit 0 is provided at an I/O terminal 162 and Bit 1 is provided at an I/O terminal 164. A truth table for the encode logic circuit 160 is as follows:

| S3 | S2 | S1 | I/O 1 | I/O 0 | State |
|---|---|---|---|---|---|
| L | L | L | 0 | 0 | (0,0) |
| H | L | L | 1 | 0 | (1,0) |
| H | H | L | 0 | 1 | (0,1) |
| H | H | H | 1 | 1 | (1,1) |

During a read operation of an n-bit memory cell, the levels of the respective output signals S3, S2, S1 of the sense amplifiers 154, 156, 158 are determined by the conductivity value to which the memory cell had been set during a programming operation. A fully erased EANVM cell 102 will be in its lowest threshold voltage state, or the highest conductivity state. Consequently, all of the reference voltages will be higher than the bit line voltage at terminal 168, resulting in a (1,1) state. A fully programmed EANVM cell 102 will be in its highest threshold voltage state, or its lowest conductivity state. Consequently, all reference voltages will be lower than the bit line voltage at terminal 168, resulting in a (0,0) state. The intermediate threshold states are encoded as is illustrated in the truth table for the logic circuit 160.

Figure 7:
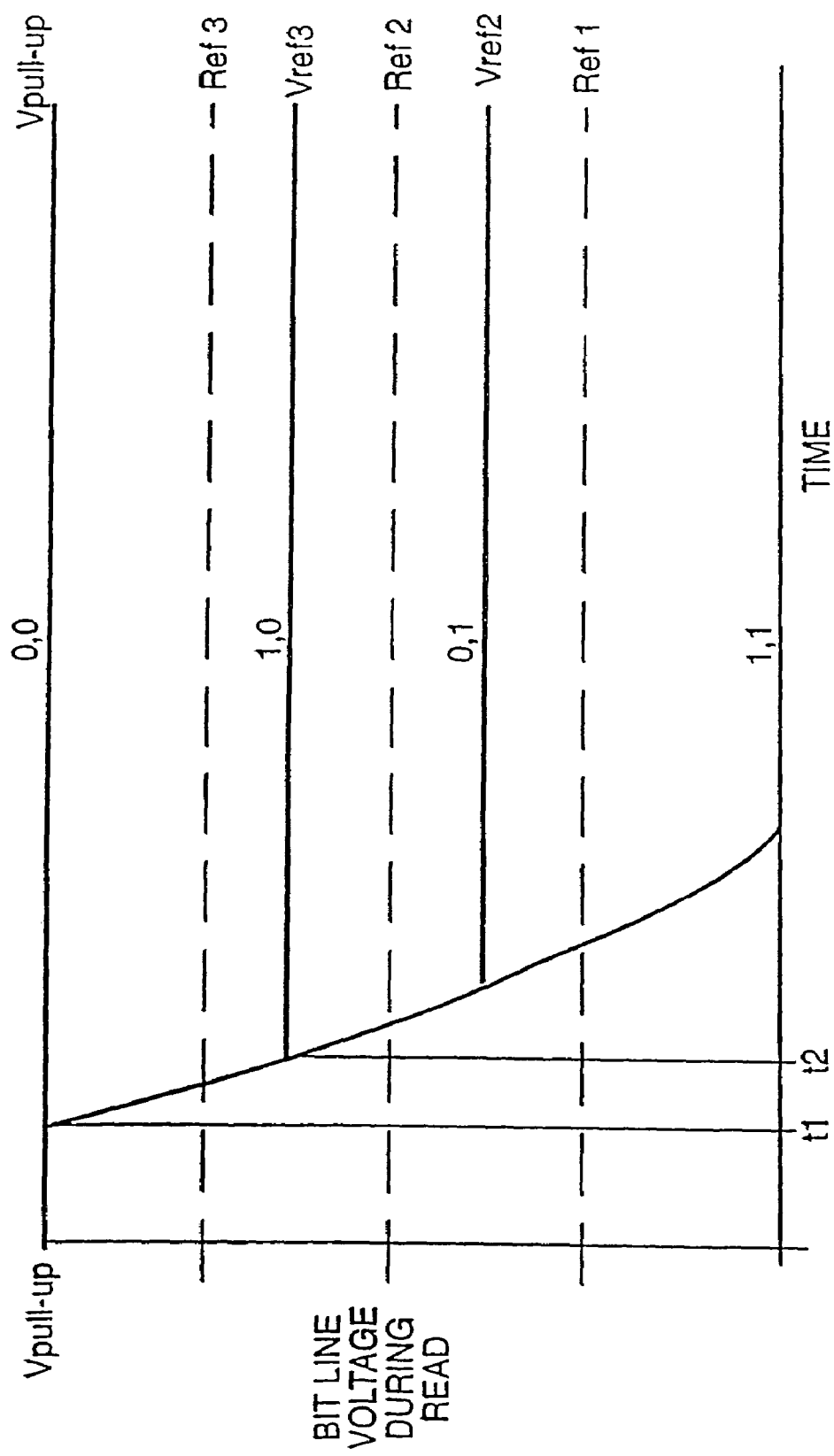
FIG. 7 shows the bit line voltage during a read cycle as a function of time for a 2-bit per cell EANVM which has been programmed to one of four possible states, (0, 0), (1, 0), (0,1) and the fully erased condition (1,1). Four separate voltage levels are represented on this figure, each representing one of the four possible states. Only one of these would be present for any given read operation.

FIG. 7 shows the bit line voltage as a function of time at terminal 168, during a read cycle, for a binary 2-bit per memory cell. For purposes of illustration, each of the four possible waveforms corresponding to the four possible programmed states of the memory cell are shown. During a read cycle only the waveform corresponding to the programmed state of the EANVM cell would occur. For example, assume the EANVM memory cell 102 has been programmed to a (1,0) state. Prior to time t1, because the EANVM cell 102 has not yet been selected or activated, the bit line 106 is pulled-up to Vpull-up. At time t1, the EANVM cell is selected using conventional memory address decoding techniques. Because the EANVM cell has been programmed to a specific conductivity level by the charge on the floating gate, the bit line is pulled down to a specific voltage level corresponding to the amount of current that the cell can sink at this specific conductivity level. When this point is reached at time t2 the bit line voltage stabilizes at a voltage level Vref3 between reference voltages Ref 3 and Ref 2 which correspond to a (1,0) state. When the EANVM cell 102 is de-selected, the bit line voltage will return to its pulled-up condition. Similarly, the bit-line voltage stabilizes at Vref2 the (0,1) state, or at zero volts for the (1,1) state.

Figure 8:
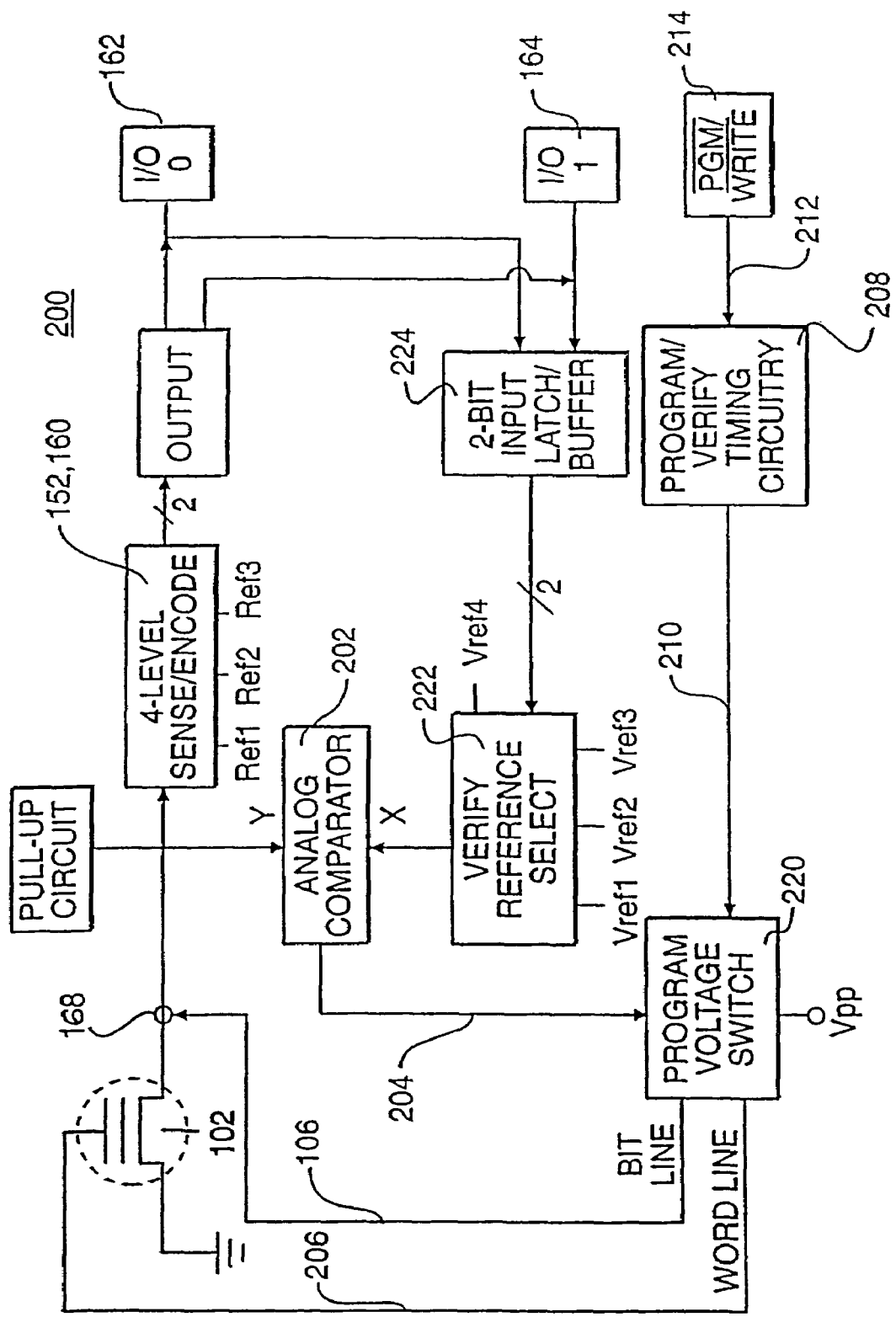
FIG. 8 is a block diagram of a multi-bit per cell system combining program/verify and read circuitry.

FIG. 8 is a block diagram of an n-bit memory cell system 200. For purposes of illustration a binary 2-bit per cell system is shown. However, the concepts of the invention extend to systems where n is greater than 2. It is also intended that the invention include any system where the EANVM memory cell has more than two states. For example, in a non-binary system, the memory states can be three or some other multiple of a non-binary system. Some of the components of this system 200 are shown and described with the same reference numerals for the components of FIG. 6 for the read mode of operation. It is intended that these same reference numerals identify the same components.

The system 200 includes a memory cell 102, as described in FIG. 1, with a bit line output terminal 168. For the read mode of operation, a 3-level sense amplifier 152 with read reference voltages Ref 1, Ref 2, and Ref 3 and an encoder 160 is provided. Read data is provided at a Bit 0 I/O terminal 162 and at a Bit 1 I/O terminal 164. For the write mode of operation, a verify reference voltage select circuit 222 provides an analog voltage reference level signal X to one input terminal of an analog comparator 202. The verify reference voltages are chosen so that as soon as the bit line voltage on bit line 106 is greater than the verify reference voltage the threshold of the EANVM cell 102 is set to the proper threshold corresponding to the memory state to which it is to be programmed. To this end the verify reference voltages Vref1, Vref2, Vref3, and Vref4 are set such that Vref4 is above Ref 3, Vref3 is between Ref 3 and Ref 2, Vref2 is between Ref 1 and Ref 2, and Vref1 is below Ref 1. During a normal read operation, the bit line voltage will settle midway between the read reference voltages to insure that the memory contents will be read accurately. The verify reference voltage select circuit 222 is controlled by the 2-output bits from a 2-bit input latch/buffer circuit 224, which receives binary input bits from the I/O terminals 162 and 164. The Y signal input terminal of the analog comparator 202 is connected to the bit line output terminal 168 of the multi-level memory cell 102. The output signal from the analog comparator is provided on a signal line 204 as an enable/disable signal for the program voltage switch 220. An output signal line 206 from the program voltage switch 220 provides the word line program voltage to the control gate of the EANVM cell 102. Another output signal line 106 constitutes the bit line and provides the bit-line programming voltage to the bit-line terminal 168 of EANVM cell 102. After a program/verify timing circuit 208 is enabled by a PGM/Write signal provided on a signal line 212 from a PGM/Write terminal 214, the timing circuit 208 provides a series of program/verify timing pulses to the program voltage switch 220 on a signal line 210. The pulse widths are set to control the programming process so that the voltage threshold of the EANVM cell 102 is incrementally altered by controlling the injection of charge onto the floating gate of the EANVM cell. Each programming cycle increases the voltage threshold and, as a result, decreases the conductance of the memory cell 102. After each internal program cycle is complete, as indicated by signal line 210 going "high", the program voltages are removed via the program voltage switch 220 and a verify cycle begins. The voltage threshold of memory cell 102 is then determined by using the comparator 202 to compare the bit line voltage at terminal 168 with the selected verify reference voltage from the verify reference voltage select circuit 222. When the bit line voltage exceeds that supplied by the verify reference voltage select circuit 222, the output signal 204 from the comparator 202 will then disable the program voltage switch 220 ending the programming cycle. For this embodiment of the invention, during a write operation, comparison of the current memory cell analog contents with the analog information to be programmed on the memory cell 102 is performed by the analog comparator 202. The verify reference voltage select circuit 222 analog output voltage X is determined by decoding the output of the n-bit input latch/buffer 224 (n=2 in the illustrative form). The Y input signal to the analog comparator 202 is taken directly from the bit line terminal 168. Note that the 3-level sense/encode circuits 152, 160, and reference voltage select circuit 222 may be completely independent as indicated in the drawing. Alternatively, they may be coupled together to alternately time share common circuit components. This is possible because the 3-level sense/encode circuits 152 and 160 are used in the read mode of operation while the verify reference voltage select circuit 222 is used only in the write/verify mode of operation.

IV. Basic Write Mode for a Multi-Bit per Cell EANVM System

In the write mode, a binary n-bit per cell EANVM system must be capable of electrically programming a memory cell to $2^n$ uniquely different threshold levels. In the two-bit per cell implementation, because it is assumed that the cell starts from the erased (1,1) state, it is only necessary to program three different thresholds (Vt1, Vt2, and Vt3) which define the (0,1), (1,0), and (0,0) states. Vt1 is the threshold required such that in the read mode, the bit line voltage will fall between Ref 1 and Ref 2. Vt2 is the threshold required such that in the read mode, the bit line voltage will fall between Ref 2 and Ref 3. Vt3 is the threshold required such that in the read mode, the bit line voltage will be greater than Ref 3.

Figure 9:
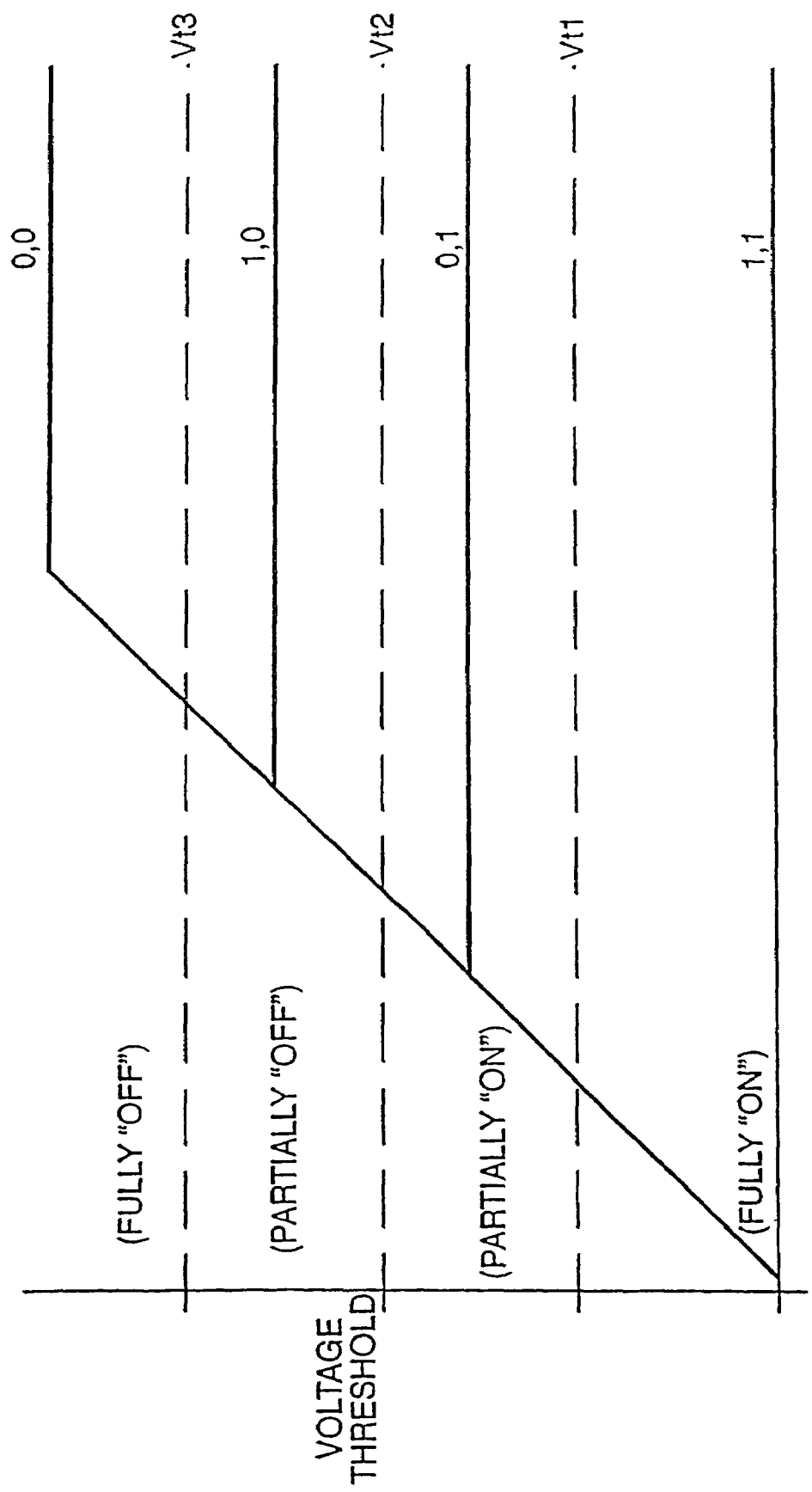
FIG. 9 is a timing diagram for the voltage threshold for a 2-bit per cell EANVM being programmed from a fully erased (1,1) state to one of the other three possible states.

FIG. 9 illustrates the change in voltage threshold for a 4-level, or 2-bit EANVM cell as the floating gate is being charged from an erased (1,1) threshold state to any one of the three other possible states. In prior art single-bit memory cells where there are only two states, the design objective is to provide enough charge to the floating gate to insure that the cell's voltage threshold is programmed as high as possible, as shown in FIG. 3. Because there is no upper threshold limit in a single-bit per cell system, overprogramming the cell will not cause incorrect data to be stored on the memory cell.

As will be appreciated from FIG. 9, in an n-bit per cell system the memory cell must be charged to a point so that the voltage threshold is within a specific voltage threshold range. In this example, where the cell is being programmed to a (1,0) state, the proper threshold range is defined as being above a threshold level Vt2 and as being below a threshold level Vt3.

To accomplish this n-level programming it is necessary to add to or modify the prior art EANVM circuitry. FIG. 8 shows the additional or modified circuits, including a reference voltage select, an n-bit latch/buffer, a program/verify timing circuit, and a comparator. The comparator can be either digital or analog.

Figure 10:
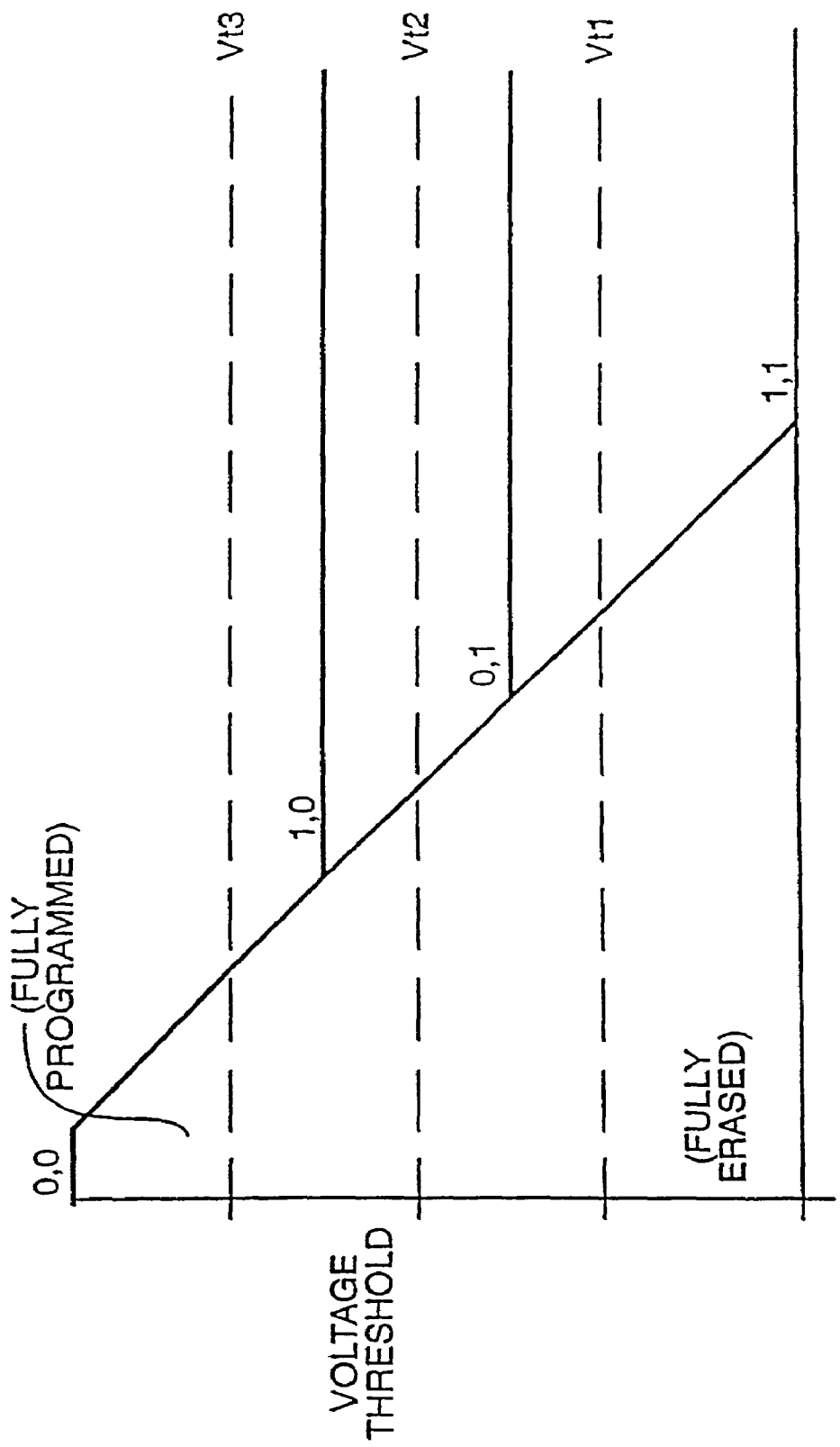
FIG. 10 is a timing diagram which illustrates the voltage threshold of a 2-bit per cell EANVM being erased from a fully programmed (0,0) state to one of the other three possible states.

FIG. 10 illustrates the voltage threshold of an EANVM cell as the floating gate is being erased from a (0,0) state. Standard EANVM programming operating procedure calls for a memory cell to be erased prior to being programmed. This erasure can be performed at the byte, block, or chip level and can be performed by electrical, UV, or other means. In this type of system the cell would be completely erased to a (1,1) state prior to initiating a programming cycle. If a system has the capability to erase an individual memory cell, then it is not necessary to erase all of the cells of a group prior to initiating a programming operation. It is then possible to incrementally erase an individual memory cell, as necessary, to program the cell to the appropriate voltage threshold as is indicated by the waveforms labelled (1,0) and (0,1).

Figure 11:
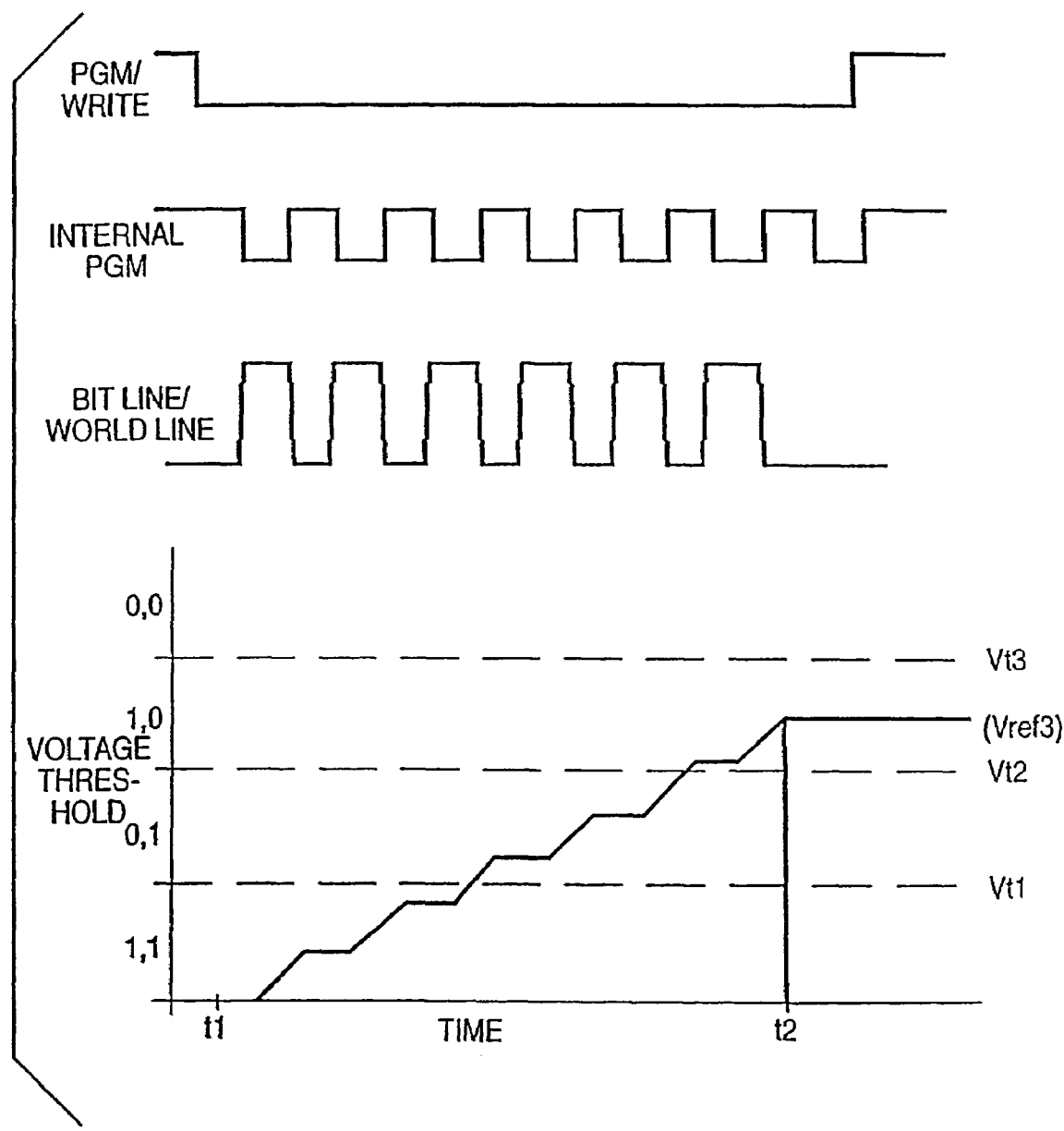
FIG. 11 is a timing diagram illustrating the voltage threshold of a 2-bit per cell EANVM during a program/verify cycle using fixed width program pulses.

FIG. 11 is a timing diagram which illustrates how a 2-bit EANVM cell of FIG. 8 is programmed from an erased (1,1) state to a (1,0) state using the timing circuitry 208 to generate fixed length timing pulses. A low logic level state of the PGM/Write signal on signal line 212 enables the timing circuit 208. When enabled at time t1, the timing circuit 208 provides an internal fixed-width low level internal PGM timing pulse on signal line 210 to the program voltage switch 220. For the duration of the low state of the internal PGM timing pulse, the bit line and word line program voltage outputs on lines, 106 and 206 will be raised to their respective programming voltage levels as shown in FIG. 11. During this programming process, charge is added to the floating gate of the memory cell 102. When the internal PGM timing pulse from timing circuitry 208 switches to a high level, the programming voltages are removed and a verify cycle begins. For this example, verify reference voltage Vref3 is compared with the bit line voltage. This internally controlled program/verify cycle repeats itself until the bit line voltage on terminal 168 exceeds Vref3. At this time, t2, the EANVM cell 102 is verified to have been programmed to a (1,0) state and programming is halted by the comparator 202 providing a disable signal on signal line 204 to the program voltage switch 220.

Figure 12:
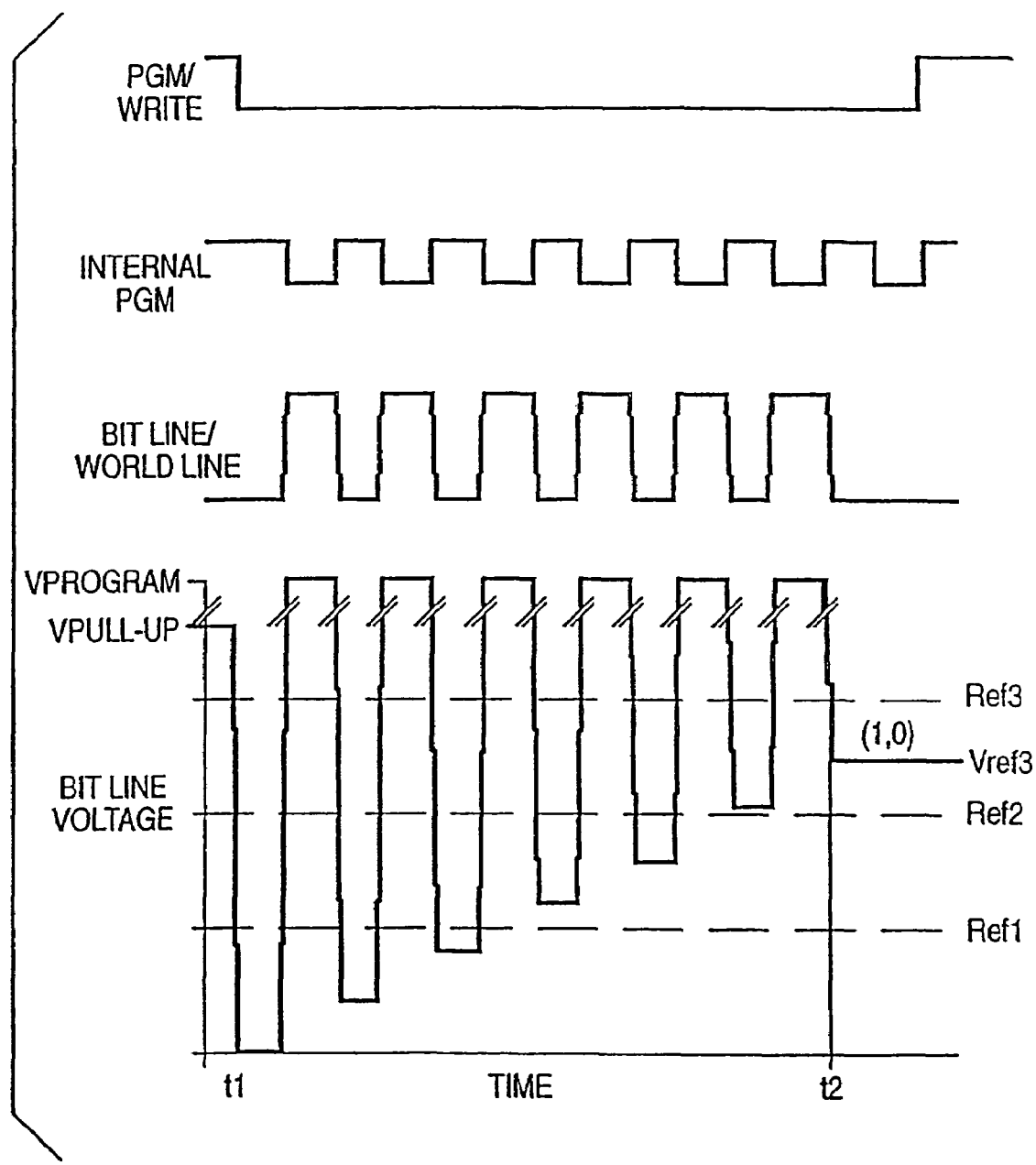
FIG. 12 is a timing diagram illustrating the bit line voltage of a 2-bit per cell EANVM during a program/verify process which uses fixed width program pulses.

FIG. 12 illustrates the bit line voltage of a 2-bit per cell EANVM as it is being programmed from a fully erased, or fully "on", state (1,1) to a partially "off" state (1,0) using fixed length program pulses. When the externally applied PGM/Write pulse is applied at time t1, the program/verify timing circuit 208 first initiates a verify cycle to determine the current status of the memory cell 102. This is indicated by the bit line voltage being pulled to a ground condition from, in this example, Vpull-up. More generally, prior to time t1, the bit line voltage could be pre-set to any voltage level. Once the cell has been determined to be at a condition below the verify reference voltage, Vref3 in this example, corresponding to the data to be programmed, the first program cycle is initiated. This is represented by the bit line voltage being pulled up to Vprogram. After the first fixed length programming pulse ends, a verify cycle begins. This is represented by the bit line voltage being pulled down to a point midway between ground potential and Ref 1. During each successive verify cycle the bit line voltage is observed to incrementally increase. This program/verify cycle continues until the bit-line voltage exceeds the selected verify reference voltage, in this case Vref3, which indicates a memory state of (1,0), at time t2.

Figure 13:
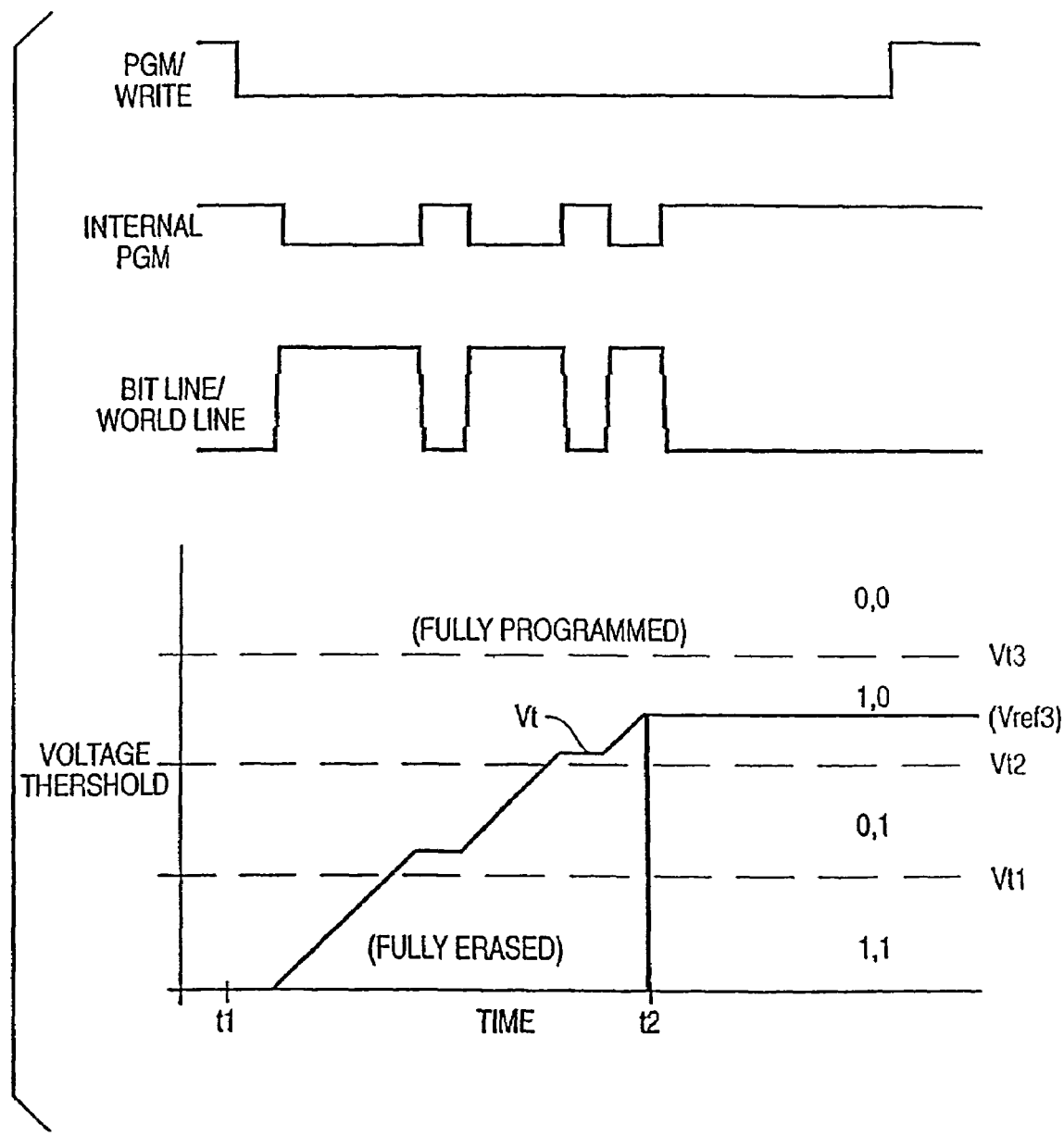
FIG. 13 is a timing diagram illustrating the voltage threshold of a 2-bit per cell EANVM during a program/verify cycle using variable width program pulses.

FIG. 13 illustrates how a 2-bit EANVM cell is programmed from an erased (1,1) state to a (1,0) state using variable length programming pulses. The internal PGM pulses for this implementation start with a low state longer than for fixed-width implementation of FIGS. 11 and 12. The low-state pulse widths grow progressively shorter as the memory cell approaches the appropriate voltage threshold. This approach requires more precise control than the fixed length approach. However, programming times can be greatly reduced on average.

Figure 14:
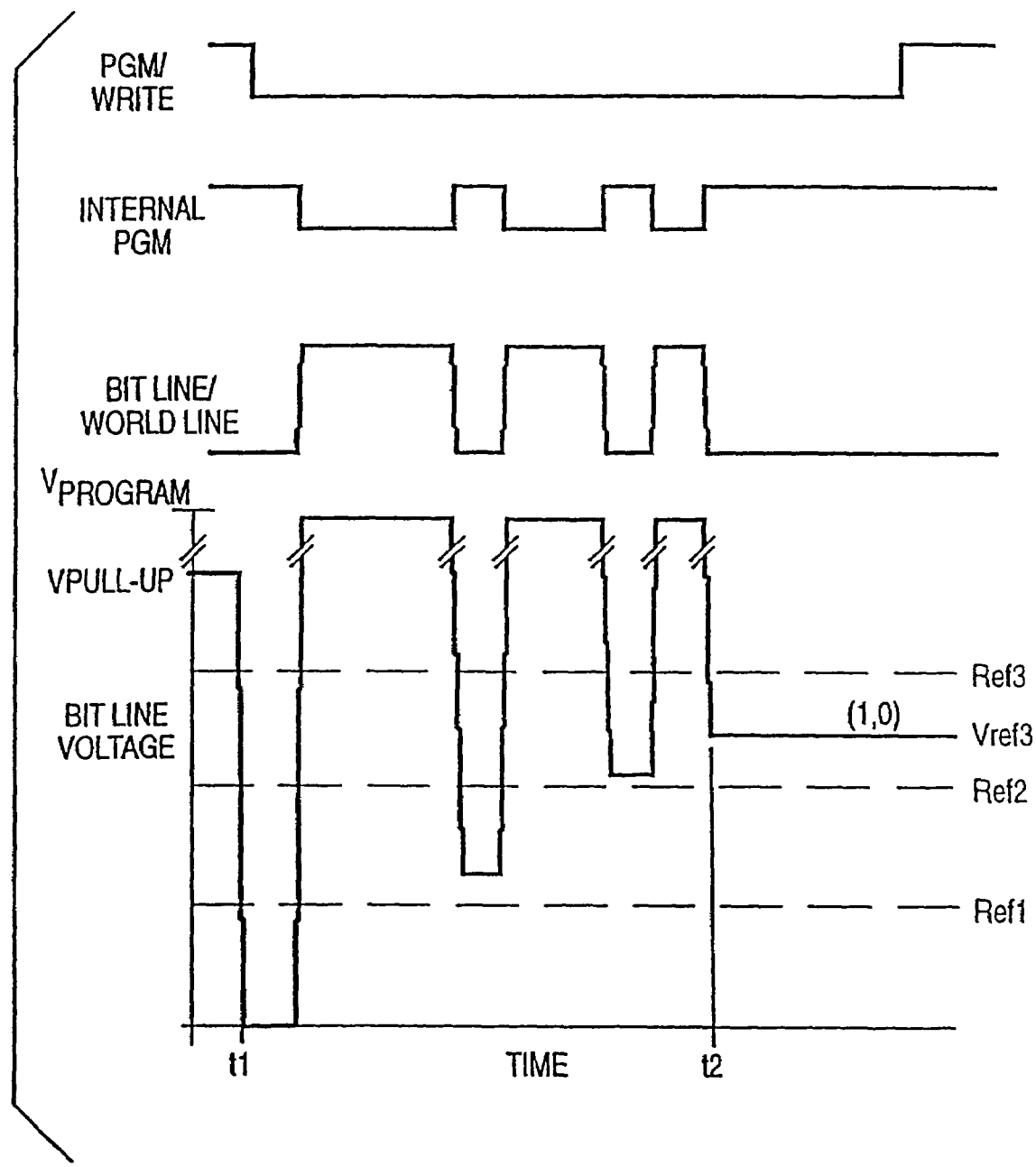
FIG. 14 is a timing diagram illustrating the bit line voltage of a 2-bit per cell EANVM during a program/verify process which uses variable width program pulses.

FIG. 14 illustrates the bit line voltage of a 2-bit per cell EANVM as it is being programmed from a fully erased, or fully "on", state (1,1) to a partially "off" state (1,0) using variable length program pulses. When the externally applied PGM/Write pulse goes to an active low level at time t1, the program/verify timing circuit 208 first initiates a verify cycle to determine the current status of the memory cell 102. This is indicated by the bit line voltage being pulled to a ground condition from, in this example, Vpull-up. Although, prior to time t1, the bit line voltage could be pre-set to any voltage level. Once the cell has been determined to be at a condition below the verify reference voltage corresponding to the data to be programmed, Vref3 in this example, the first program cycle is initiated. This is represented by the bit line voltage being pulled up to Vprogram. After the first variable length programming pulse is over, another verify cycle begins. This is represented by the bit line voltage being pulled down to a point midway between Ref 1 and Ref 2. During each successive verify cycle the bit line voltage is observed to incrementally increase. This program/verify cycle continues until the bit-line-voltage surpasses the selected verify reference voltage, in this case Vref3 which indicates a memory state of (1,0), at time t2.

Accordingly, the programming process for an n-bit per cell EANVM uses program/verify cycles, to incrementally program a cell. The durations of these cycles are determined by the timing circuit 208. A key element of the system is to provide a programming scheme which provides for accurate programming of the memory cell 102. This is accomplished by matching the pulse widths of the timing pulses of the timing circuitry 208 to the program time of the EANVM cell being used. As indicated in FIGS. 11 and 13, a desired voltage threshold actually falls within a range of threshold voltages. If the program pulses are too long, then too much charge may be added to the floating gate of the memory cell 102. This may result in an overshoot of the target voltage threshold, resulting in incorrect data being stored in the memory cell.

The programming pulse width is set such that if the voltage threshold of the cell 102 after the (n−1)th programming pulse is at a point just below the target voltage threshold, then the (n)th, or final, program pulse will not cause an overshoot resulting in an overprogrammed condition for a memory cell.

FIG. 8 may also use a digital comparator rather than the analog comparator 202 shown in FIG. 8. The digital comparator would use the encoded data from the encode circuitry 160, which represents the current contents of the EANVM cell 102, as the input to the comparator. The verify reference voltage select 222 would provide the voltage to be encoded with the input coming from the output of the n-bit input latch/buffer 224, representing the data to be programmed. Otherwise, the function of the comparator within the system remains the same.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. For an electrically alterable non-volatile multi-level memory device including a plurality of non-volatile multi-level memory cells, each of the multi-level memory cells including a floating gate FET having a channel with electrically alterable voltage threshold value, electrons being capable of being injected into the floating gate, a method of operating the electrically alterable non-volatile multi-level memory device, comprising:

setting a parameter of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and reading status of the one non-volatile multi-level memory cell from an output from a bit line coupled to a drain terminal of the one non-volatile multi-level memory cell, wherein the operation of setting the parameter includes a program operation, in which electrons are injected into the floating gate of the one non-volatile multi-level memory cell using at least one programming voltage applied to the bit line, wherein the program operation includes a series of programming operations each followed by a related verifying operation, and wherein the series of programming operations includes a first programming operation and a second programming operation after the first programming operation, the duration of the second programming operation being shorter than that of the first programming operation.

2. The method of operating the electrically alterable non-volatile multi-level memory device according to claim 1, wherein the first programming operation is carried out using the programming voltage of a single pulse, and the second programming operation is carried out using the programming voltage of a single pulse.

3. The method of operating the electrically alterable non-volatile multi-level memory device according to claim 1, wherein each said verifying operation verifies whether the parameter of the one non-volatile multi-level memory cell has been set to the one state selected from the plurality of states, and includes comparing the parameter of the one non-volatile multi-level memory cell with one of a plurality of verifying reference parameters including at least a first verifying reference parameter, a second verifying reference parameter, a third verifying reference parameter and a fourth verifying reference parameter.

4. The method of operating the electrically alterable non-volatile multi-level memory device according to claim 1,
wherein the operation of setting the parameter includes an erasure operation in which non-volatile multi-level memory cells of one of a byte, a block and a chip level can be erased.

5. The method of operating the electrically alterable non-volatile multi-level memory device according to claim 1,
wherein each of the plurality of non-volatile multi-level memory cells has a control gate, and a control gate of a memory cell to be programmed is supplied with a predetermined potential which is different from a potential being supplied to a control gate of a non-selected cell.

6. An electrically alterable non-volatile multi-level memory device including a plurality of non-volatile multi-level memory cells, each of the multi-level memory cells including a floating gate FET having a channel with electrically alterable voltage threshold value, electrons being capable of being injected into the floating gate, the electrically alterable non-volatile multi-level memory device having the following operations:
an operation of controlling an electrical value of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and
an operation of reading status of the one non-volatile multi-level memory cell from an output from a bit line coupled to a drain terminal of the one non-volatile multi-level memory cell,
wherein the operation of controlling the electrical value includes a program operation, in which electrons are injected into the floating gate of the one non-volatile multi-level memory cell using at least one programming voltage applied to the bit line,
wherein the program operation includes a series of programming operations each followed by a related verifying operation, and
wherein the series of programming operations includes a first programming operation and a second programming operation after the first programming operation, the duration of the second programming operation being shorter than that of the first programming operation.

7. The electrically alterable non-volatile multi-level memory device according to claim 6,
wherein the first programming operation is carried out using the programming voltage of a single pulse, and the second programming operation is carried out using the programming voltage of a single pulse.

8. The electrically alterable non-volatile multi-level memory device according to claim 6,
wherein each said verifying operation verifies whether the electrical value of the one non-volatile multi-level memory cell has been controlled to the one state selected from the plurality of states, and includes comparing the electrical value of the one non-volatile multi-level memory cell with one of a plurality of verifying reference parameters including at least a first verifying reference parameter, a second verifying reference parameter, a third verifying reference parameter and a fourth verifying reference parameter.

9. The electrically alterable non-volatile multi-level memory device according to claim 6,
wherein the operation of controlling the electrical value includes an erasure operation in which non-volatile multi-level memory cells of one of a byte, a block and a chip level can be erased.

10. The electrically alterable non-volatile multi-level memory device according to claim 6,
wherein each of the plurality of non-volatile multi-level memory cells has a control gate, and a control gate of a memory cell to be programmed is supplied with a predetermined potential which is different from a potential being supplied to a control gate of a non-selected cell.

11. For an electrically alterable non-volatile multi-level memory device including a plurality of non-volatile multi-level memory cells, each of the multi-level memory cells including a floating gate FET having a control gate, a floating gate and a channel with electrically alterable voltage threshold value, electrons being capable of being injected into the floating gate, a method of operating the electrically alterable non-volatile multi-level memory device, comprising:
setting a parameter of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and
reading status of the one non-volatile multi-level memory cell from an output from a bit line coupled to a drain terminal of the one non-volatile multi-level memory cell,
wherein the operation of setting the parameter includes a program operation, in which electrons are injected into the floating gate of the one non-volatile multi-level memory cell using at least one programming voltage applied to the control gate of a memory cell to be programmed,
wherein the program operation includes a series of programming operations each followed by a related verifying operation, and
wherein the series of programming operations includes a first programming operation and a second programming operation after the first programming operation, the duration of the second programming operation being shorter than that of the first programming operation.

12. The method of operating the electrically alterable non-volatile multi-level memory device according to claim 11,
wherein the first programming operation is carried out using the programming voltage of a single pulse, and the second programming operation is carried out using the programming voltage of a single pulse.

13. The method of operating the electrically alterable non-volatile multi-level memory device according to claim 11,
wherein each said verifying operation verifies whether the parameter of the one non-volatile multi-level memory cell has been set to the one state selected from the plurality of states, and includes comparing the parameter of the one non-volatile multi-level memory cell with one of a plurality of verifying reference parameters including at least a first verifying reference parameter, a second verifying reference parameter, a third verifying reference parameter and a fourth verifying reference parameter.

14. The method of operating the electrically alterable non-volatile multi-level memory device according to claim 11,
wherein the operation of setting the parameter includes an erasure operation in which non-volatile multi-level memory cells of one of a byte, a block and a chip level can be erased.

15. The method of operating the electrically alterable non-volatile multi-level memory device according to claim 11,
wherein a bit line coupled with a memory cell to be programmed is supplied with a predetermined potential which is different from a potential being supplied to a bit line coupled with a non-selected cell.

16. An electrically alterable non-volatile multi-level memory device including a plurality of non-volatile multi-level memory cells, each of the multi-level memory cells including a floating gate FET having a channel with electrically alterable voltage threshold value, electrons being capable of being injected into the floating gate, the electrically alterable non-volatile multi-level memory device having the following operations:
an operation of controlling an electrical value of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and
an operation of reading status of the one non-volatile multi-level memory cell from an output from a bit line coupled to a drain terminal of the one non-volatile multi-level memory cell,
wherein the operation of controlling the electrical value includes a program operation, in which electrons are injected into the floating gate of the one non-volatile multi-level memory cell using at least one programming voltage applied to a control gate of a memory cell to be programmed,
wherein the program operation includes a series of programming operations each followed by a related verifying operation, and
wherein the series of programming operations includes a first programming operation and a second programming operation after the first programming operation, the duration of the second programming operation being shorter than that of the first programming operation.

17. The electrically alterable non-volatile multi-level memory device according to claim 16,
wherein the first programming operation is carried out using the programming voltage of a single pulse, and the second programming operation is carried out using the programming voltage of a single pulse.

18. The electrically alterable non-volatile multi-level memory device according to claim 16,
wherein each said verifying operation verifies whether the electrical value of the one non-volatile multi-level memory cell has been controlled to the one state selected from the plurality of states, and includes comparing the electrical value of the one non-volatile multi-level memory cell with one of a plurality of verifying reference parameters including at least a first verifying reference parameter, a second verifying reference parameter, a third verifying reference parameter and a fourth verifying reference parameter.

19. The electrically alterable non-volatile multi-level memory device according to claim 16,
wherein the operation of controlling the electrical value includes an erasure operation in which non-volatile multi-level memory cells of one of a byte, a block and a chip level can be erased.

20. The electrically alterable non-volatile multi-level memory device according to claim 16,
wherein the bit line coupled with a memory cell to be programmed is supplied with a predetermined potential which is different from a potential being supplied to a bit line coupled with a non-selected cell.

21. For an electrically alterable non-volatile multi-level memory including a plurality of non-volatile multi-level memory cells, each of the multi-level memory cells including a floating gate FET having a channel with electrically alterable voltage threshold value, electrons being capable of being injected into the floating gate, a method of operating the electrically alterable non-volatile multi-level memory, comprising:
setting a voltage threshold value of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and
reading status of the one non-volatile multi-level memory cell from an output from a bit line coupled to a drain terminal of the one non-volatile multi-level memory cell,
wherein the operation of setting the voltage threshold value of the one non-volatile multi-level memory cell includes a program operation, in which electrons are injected into the floating gate of the one non-volatile multi-level memory cell using at least one programming voltage applied to the bit line,
wherein the program operation includes a series of programming operations each followed by a related verifying operation,
wherein the series of programming operations includes a first programming operation and a second programming operation after the first programming operation, and
wherein a parameter of the first programming operation has a first predetermined value and a same parameter of the second programming operation has a second predetermined value different from the first predetermined value so that a first voltage threshold value change of the one non-volatile multi-level memory cell caused by the first programming operation is substantially larger than a second voltage threshold value change of the one non-volatile multi-level memory cell caused by the second programming operation.

22. The method of operating the electrically alterable non-volatile multi-level memory according to claim 21,
wherein said parameter includes a duration of the respective programming operation.

23. The method of operating the electrically alterable non-volatile multi-level memory according to claim 21,
wherein the first programming operation is carried out using the programming voltage of a single pulse, and the second programming operation is carried out using the programming voltage of a single pulse.

24. The method of operating the electrically alterable non-volatile multi-level memory according to claim 21, wherein each said verifying operation verifies whether the voltage threshold value of the one non-volatile multi-level memory cell has been set to the one state selected from the plurality of states, and includes comparing the voltage threshold value of the one non-volatile multi-level memory cell with one of a plurality of verifying reference parameters including at least a first verifying reference parameter, a second verifying reference parameter, a third verifying reference parameter and a fourth verifying reference parameter.

25. The method of operating the electrically alterable non-volatile multi-level memory according to claim 21, wherein the operation of setting the voltage threshold value includes an erasure operation in which non-volatile multi-level memory cells of one of a byte, a block and a chip level can be erased.

26. The method of operating the electrically alterable non-volatile multi-level memory according to claim 21, wherein each of the plurality of non-volatile multi-level memory cells has a control gate, and a control gate of a memory cell to be programmed is supplied with a predetermined potential which is different from a potential being supplied to a control gate of non-selected cell.

27. An electrically alterable non-volatile multi-level memory including a plurality of non-volatile multi-level memory cells, each of the multi-level memory cells including a floating gate FET having a channel with electrically alterable voltage threshold value, electrons being capable of being injected into the floating gate, the electrically alterable non-volatile multi-level memory having the following operations:
an operation of controlling a voltage threshold value of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and
an operation of reading status of the one non-volatile multi-level memory cell from an output from a bit line coupled to a drain terminal of the one non-volatile multi-level memory cell,
wherein the operation of controlling the voltage threshold value of the one non-volatile multi-level memory cell includes a program operation, in which electrons are injected into the floating gate of the one non-volatile multi-level memory cell using at least one programming voltage applied to the bit line,
wherein the program operation includes a series of programming operations each followed by a related verifying operation,
wherein the series of programming operations includes a first programming operation and a second programming operation after the first programming operation, and
wherein a parameter of the first programming operation has a first predetermined value and a same parameter of the second programming operation has a second predetermined value different from the first predetermined value so that a first voltage threshold value change of the one non-volatile multi-level memory cell caused by the first programming operation is substantially larger than a second voltage threshold value change of the one non-volatile multi-level memory cell caused by the second programming operation.

28. The electrically alterable non-volatile multi-level memory according to claim 27, wherein said parameter includes a duration of the respective programming operation.

29. The electrically alterable non-volatile multi-level memory according to claim 27, wherein the first programming operation is carried out using the programming voltage of a single pulse, and the second programming operation is carried out using the programming voltage of a single pulse.

30. The electrically alterable non-volatile multi-level memory according to claim 27, wherein each said verifying operation verifies whether the voltage threshold value of the one non-volatile multi-level memory cell has been controlled to the one state selected from the plurality of states, and includes comparing the voltage threshold value of the one non-volatile multi-level memory cell with one of a plurality of verifying reference parameters including at least a first verifying reference parameter, a second verifying reference parameter, a third verifying reference parameter and a fourth verifying reference parameter.

31. The electrically alterable non-volatile multi-level memory according to claim 27, wherein the operation of controlling the voltage threshold value includes an erasure operation in which non-volatile multi-level memory cells of one of a byte, a block and a chip level can be erased.

32. The electrically alterable non-volatile multi-level memory according to claim 27, wherein each of the plurality of non-volatile multi-level memory cells has a control gate, and a control gate of a memory cell to be programmed is supplied with a predetermined potential which is different from a potential being supplied to a control gate of a non-selected cell.

33. For an electrically alterable non-volatile multi-level memory including a plurality of non-volatile multi-level memory cells, each of the multi-level memory cells including a floating gate FET having a control gate, a floating gate and a channel with electrically alterable voltage threshold value, electrons being capable of being injected into the floating gate, a method of operating the electrically alterable non-volatile multi-level memory, comprising:
setting a voltage threshold value of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and
reading status of the one non-volatile multi-level memory cell from an output from a bit line coupled to a drain terminal of the one non-volatile multi-level memory cell,
wherein the operation of setting the voltage threshold value of the one non-volatile multi-level memory cell includes a program operation, in which electrons are injected into the floating gate of the one non-volatile multi-level memory cell using at least one programming voltage applied to the control gate of the one memory cell, wherein the program operation includes a series of programming operations each followed by a related verifying operation, wherein the series of programming operations includes a first programming operation and a second programming operation after the first programming operation, and wherein a parameter of the first programming operation has a first predetermined value and a same parameter of the second programming operation has a second predetermined value different from the first predetermined value so that a first voltage threshold value change of the one non-volatile multi-level memory cell caused by the first programming operation is substantially larger than a second voltage threshold value change of the one non-volatile multi-level memory cell caused by the second programming operation.

34. The method of operating the electrically alterable non-volatile multi-level memory according to claim 33,
wherein said parameter includes a duration of the respective programming operation.

35. The method of operating the electrically alterable non-volatile multi-level memory according to claim 33,
wherein the first programming operation is carried out using the programming voltage of a single pulse, and the second programming operation is carried out using the programming voltage of a single pulse.

36. The method of operating the electrically alterable non-volatile multi-level memory according to claim 33,
wherein each said verifying operation verifies whether the voltage threshold value of the one non-volatile multi-level memory cell has being set to the one state selected from the plurality of states, and includes comparing the voltage threshold value of the one non-volatile multi-level memory cell with one of a plurality of verifying reference parameters including at least a first verifying reference parameter, a second verifying reference parameter, a third verifying reference parameter and a fourth verifying reference parameter.

37. The method of operating the electrically alterable non-volatile multi-level memory according to claim 33,
wherein the operation of setting the voltage threshold value includes an erasure operation in which non-volatile multi-level memory cells of one of a byte, a block and a chip level can be erased.

38. The method of operating the electrically alterable non-volatile multi-level memory according to claim 33,
wherein a bit line coupled with a memory cell to be programmed is supplied with a predetermined potential which is different from a potential being supplied to a bit line coupled with a non-selected cell.

39. An electrically alterable non-volatile multi-level memory including a plurality of non-volatile multi-level memory cells, each of the multi-level memory cells including a floating gate FET having a control gate, a floating gate and a channel with electrically alterable voltage threshold value, electrons being capable of being injected into the floating gate, the electrically alterable non-volatile multi-level memory having the following operations:

an operation of controlling a voltage threshold value of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and an operation of reading status of the one non-volatile multi-level memory cell from an output from a bit line coupled to a drain terminal of the one non-volatile multi-level memory cell, wherein the operation of controlling the voltage threshold value of the one non-volatile multi-level memory cell includes a program operation, in which electrons are injected into the floating gate of the one non-volatile multi-level memory cell using at least one programming voltage applied to the control gate of the one memory cell, wherein the program operation includes a series of programming operations each followed by a related verifying operation, wherein the series of programming operations includes a first programming operation and a second programming operation after the first programming operation, and wherein a parameter of the first programming operation has a first predetermined value and a same parameter of the second programming operation has a second predetermined value different from the first predetermined value so that a first voltage threshold value change of the one non-volatile multi-level memory cell caused by the first programming operation is substantially larger than a second voltage threshold value change of the one non-volatile multi-level memory cell caused by the second programming operation.

40. The electrically alterable non-volatile multi-level memory according to claim 39,
wherein said parameter includes a duration of the respective programming operation.

41. The electrically alterable non-volatile multi-level memory according to claim 39,
wherein the first programming operation is carried out using the programming voltage of a single pulse, and the second programming operation is carried out using the programming voltage of a single pulse.

42. The electrically alterable non-volatile multi-level memory according to claim 39,
wherein each said verifying operation verifies whether the voltage threshold value of the one non-volatile multi-level memory cell has been controlled to the one state selected from the plurality of states, and includes comparing the voltage threshold value of the one non-volatile multi-level memory cell with one of a plurality of verifying reference parameters including at least a first verifying reference parameter, a second verifying reference parameter, a third verifying reference parameter and a fourth verifying reference parameter.

43. The electrically alterable non-volatile multi-level memory according to claim 39,
wherein the operation of controlling the voltage threshold value includes an erasure operation in which non-volatile multi-level memory cells of one of a byte, a block and a chip level can be erased.

44. The electrically alterable non-volatile multi-level memory according to claim 39,
wherein a bit line coupled with a memory cell to be programmed is supplied with a predetermined potential which is different from a potential being supplied to a bit line coupled with a non-selected cell.

45. For an electrically alterable non-volatile multi-level memory device including a plurality of non-volatile multi-level memory cells, each of the multi-level memory cells including a floating gate FET having a control gate, a floating gate and a channel with electrically alterable voltage threshold value, electrons being capable of being injected into the floating gate, a method of operating the electrically alterable non-volatile multi-level memory device, comprising:

setting a parameter of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and reading status of the one non-volatile multi-level memory cell from an output from a bit line coupled to a drain terminal of the one non-volatile multi-level memory cell, wherein the operation of setting the parameter includes a program operation, in which electrons are injected into the floating gate of the one non-volatile multi-level memory cell using programming voltages applied to the bit line and the control gate, respectively, wherein the program operation includes a series of programming operations each followed by a related verifying operation, wherein the series of programming operations includes a first programming operation and a second programming operation after the first programming operation, the duration of the second programming operation being shorter than that of the first programming operation.

46. The method of operating the electrically alterable non-volatile multi-level memory device according to claim 45, wherein the first programming operation is carried out using the programming voltages, each of which is of a single pulse, and the second programming operation is carried out using the programming voltages, each of which is of a single pulse.

47. The method of operating the electrically alterable non-volatile multi-level memory device according to claim 45, wherein each said verifying operation verifies whether the parameter of the one non-volatile multi-level memory cell has been set to the one state selected from the plurality of states, and includes comparing the parameter of the one non-volatile multi-level memory cell with one of a plurality of verifying reference parameters including at least a first verifying reference parameter, a second verifying reference parameter, a third verifying reference parameter and a fourth verifying reference parameter.

48. The method of operating the electrically alterable non-volatile multi-level memory device according to claim 45, wherein the operation of setting the parameter includes an erasure operation in which non-volatile multi-level memory cells of one of a byte, a block and a chip level can be erased.

49. The method of operating the electrically alterable non-volatile multi-level memory device according to claim 45, wherein the control gate of a memory cell to be programmed is supplied with a predetermined potential which is different from a potential being supplied to a control gate of a non-selected cell.

50. An electrically alterable non-volatile multi-level memory including a plurality of non-volatile multi-level memory cells, each of the multi-level memory cells including a floating gate FET having a control gate, a floating gate and a channel with electrically alterable voltage threshold value, electrons being capable of being injected into the floating gate, the electrically alterable non-volatile multi-level memory having the following operations:

an operation of controlling a voltage threshold value of at least one non-volatile multi-level memory cell of the plurality of non-volatile multi-level memory cells to one state selected from a plurality of states including at least a first state, a second state, a third state and a fourth state in response to information to be stored in the one non-volatile multi-level memory cell, and an operation of reading status of the one non-volatile multi-level memory cell from an output from a bit line coupled to a drain terminal of the one non-volatile multi-level memory cell, wherein the operation of controlling the voltage threshold value of the one non-volatile multi-level memory cell includes a program operation, in which electrons are injected into the floating gate of the one non-volatile multi-level memory cell using programming voltages applied to the bit line and the control gate, respectively, wherein the program operation includes a series of programming operations each followed by a related verifying operation, wherein the series of programming operations include a first programming operation and a second programming operation after the first programming operation, and wherein a parameter of the first programming operation has a first predetermined value and a same parameter of the second programming operation has a second predetermined value different from the first predetermined value so that a first voltage threshold value change of the one non-volatile multi-level memory cell caused by the first programming operation is substantially larger than a second voltage threshold value change of the one non-volatile multi-level memory cell caused by the second programming operation.

51. The electrically alterable non-volatile multi-level memory according to claim 50, wherein said parameter includes a duration of the respective programming operation.

52. The electrically alterable non-volatile multi-level memory according to claim 50, wherein the first programming operation is carried out using the programming voltages, each of which is of a single pulse, and the second programming operation is carried out using the programming voltages, each of which is of a single pulse.

53. The electrically alterable non-volatile multi-level memory according to claim 50, wherein each said verifying operation verifies whether the voltage threshold value of the one non-volatile multi-level memory cell has been controlled to the one state selected from the plurality of states, and includes comparing the voltage threshold value of the one non-volatile multi-level memory cell with one of a plurality of verifying reference parameters including at least a first verifying reference parameter, a second verifying reference parameter, a third verifying reference parameter and a fourth verifying reference parameter.

54. The electrically alterable non-volatile multi-level memory according to claim 50, wherein the operation of controlling the voltage threshold value includes an erasure operation in which non-volatile multi-level memory cells of one of a byte, a block and a chip level can be erased.

55. The electrically alterable non-volatile multi-level memory according to claim 50,
wherein a bit line coupled with a memory cell to be programmed is supplied with a predetermined potential which is different from a potential being supplied to a bit line coupled with a non-selected cell.

56. The method of operating the electrically alterable non-volatile multi-level memory device according to claim 1,
wherein the program operation includes a verify operation before the series of programming operations.

57. The electrically alterable non-volatile multi-level memory device according to claim 6,
wherein the program operation includes a verify operation before the series of programming operations.

58. The method of operating the electrically alterable non-volatile multi-level memory device according to claim 11,
wherein the program operation includes a verify operation before the series of programming operations.

59. The electrically alterable non-volatile multi-level memory device according to claim 16,
wherein the program operation includes a verify operation before the series of programming operations.

60. The method of operating the electrically alterable non-volatile multi-level memory according to claim 21,
wherein the program operation includes a verify operation before the series of programming operations.

61. The electrically alterable non-volatile multi-level memory according to claim 27,
wherein the program operation includes a verify operation followed by the series of programming operations.

62. The method of operating the electrically alterable non-volatile multi-level memory according to claim 33,
wherein the program operation includes a verify operation followed by the series of programming operations.

63. The electrically alterable non-volatile multi-level memory according to claim 39,
wherein the program operation includes a verify operation followed by the series of programming operations.

64. The method of operating the electrically alterable non-volatile multi-level memory according to claim 45,
wherein the program operation includes a verify operation followed by the series of programming operations.

65. The electrically alterable non-volatile multi-level memory according to claim 50,
wherein the program operation includes a verify operation followed by the series of programming operations.

* * * * *